(12) United States Patent
Takata

(10) Patent No.: US 12,438,522 B2
(45) Date of Patent: Oct. 7, 2025

(54) FILTER AND MULTIPLEXER

(71) Applicant: Murata Manufacturing Co., Ltd., Nagaokakyo (JP)

(72) Inventor: Toshiaki Takata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 266 days.

(21) Appl. No.: 18/138,204

(22) Filed: Apr. 24, 2023

(65) Prior Publication Data

US 2023/0261640 A1 Aug. 17, 2023

Related U.S. Application Data

(63) Continuation of application No. PCT/JP2021/041591, filed on Nov. 11, 2021.

(30) Foreign Application Priority Data

Nov. 17, 2020 (JP) ................................ 2020-191178

(51) Int. Cl.
*H03H 9/56* (2006.01)
*H03H 9/13* (2006.01)
*H03H 9/70* (2006.01)

(52) U.S. Cl.
CPC .............. *H03H 9/568* (2013.01); *H03H 9/13* (2013.01); *H03H 9/70* (2013.01)

(58) Field of Classification Search
CPC ............ H03H 9/568; H03H 9/13; H03H 9/70; H03H 9/02992; H03H 9/6436;

(Continued)

(56) References Cited

U.S. PATENT DOCUMENTS 10,476,482 B2 * 11/2019 Niwa ....................... H04B 1/18
2012/0176206 A1 7/2012 Inoue et al.

(Continued)

FOREIGN PATENT DOCUMENTS

JP 6090416 A 5/1985
JP 2011071874 A 4/2011

(Continued)

OTHER PUBLICATIONS

International Search Report in PCT/JP2021/041591, mailed Jan. 25, 2022, 3 pages.

(Continued)

*Primary Examiner* — John W Poos
(74) *Attorney, Agent, or Firm* — Keating & Bennett, LLP

(57) ABSTRACT

A filter includes a first filter circuit and an additional circuit. The first filter circuit includes a resonator electrode and a main wire. The main wire includes first and second metal films, the second metal film being in contact with the first metal film. The additional circuit includes an IDT electrode group including IDT electrodes and a sub-wire connecting the IDT electrode group to the first filter circuit. At least a portion of the sub-wire includes a third metal film connected to the IDT electrode group. The third metal film is covered with a fourth metal film with an insulating layer interposed therebetween, the insulating layer being provided on the third metal film. The fourth metal film is connected to a ground terminal on a substrate.

20 Claims, 15 Drawing Sheets

(58) Field of Classification Search
CPC .... H03H 9/542; H03H 9/725; H03H 9/14541; H03H 9/6483
See application file for complete search history.

(56) References Cited

U.S. PATENT DOCUMENTS

| | | |
|---|---|---|
| 2013/0234558 A1 | 9/2013 | Tsuda |
| 2016/0142041 A1* | 5/2016 | Kuwahara ............ H03H 9/1085 333/195 |
| 2017/0099043 A1* | 4/2017 | Goto ..................... H03H 9/725 |
| 2018/0069529 A1 | 3/2018 | Bi et al. |
| 2018/0131349 A1* | 5/2018 | Takata ................. H03H 9/6483 |
| 2019/0207583 A1 | 7/2019 | Miura et al. |
| 2020/0304104 A1* | 9/2020 | Araki ................... H03H 9/6489 |
| 2020/0321941 A1 | 10/2020 | Genji |

FOREIGN PATENT DOCUMENTS

| | | |
|---|---|---|
| JP | 2017092945 A | 5/2017 |
| JP | 2018038040 A | 3/2018 |
| JP | 2018166340 A | 10/2018 |
| JP | 2019121879 A | 7/2019 |
| KR | 20180050229 A | 5/2018 |
| KR | 20200057092 A | 5/2020 |
| WO | 2012063521 A1 | 5/2012 |
| WO | 2020138290 A1 | 7/2020 |

OTHER PUBLICATIONS

Written Opinion in PCT/JP2021/041591, mailed Jan. 25, 2022, 4 pages.

* cited by examiner

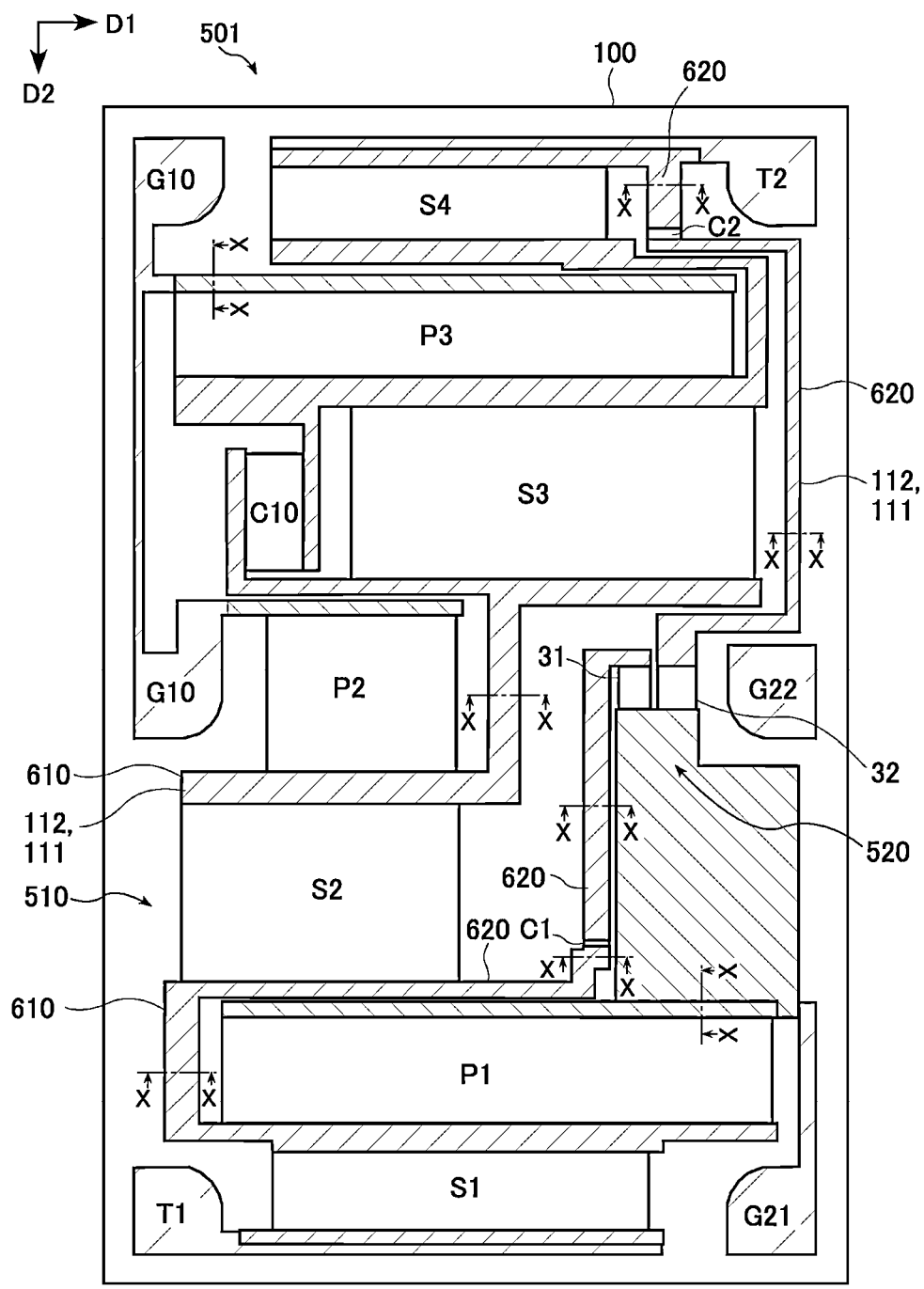

FIG. 14

| | IDT ELECTRODE GROUP 25 | | | | |
|---|---|---|---|---|---|
| | IDT ELECTRODE INTERSECTING WIDTH | IDT ELECTRODE 31 NUMBER OF ELECTRODE FINGERS | IDT ELECTRODE 32 NUMBER OF ELECTRODE FINGERS | IDT ELECTRODE 31 INTERSECTING WIDTH × NUMBER OF ELECTRODE FINGERS | IDT ELECTRODE 32 INTERSECTING WIDTH × NUMBER OF ELECTRODE FINGERS |
| EMBODIMENT | 80.1 μm | 18 | 22 | 1441.8 | 1762.2 |
| COMPARATIVE EXAMPLE 1 | 80.1 μm | 18 | 22 | 1549.8 | 1894.2 |
| COMPARATIVE EXAMPLE 2 | 80.1 μm | 18 | 22 | 1441.8 | 1762.2 |

FIG. 15

| | CAPACITANCE ELEMENT C1 | | | CAPACITANCE ELEMENT C2 | | |
|---|---|---|---|---|---|---|
| | INTERSECTING WIDTH | NUMBER OF ELECTRODE FINGERS | INTERSECTING WIDTH × NUMBER OF ELECTRODE FINGERS | INTERSECTING WIDTH | NUMBER OF ELECTRODE FINGERS | INTERSECTING WIDTH × NUMBER OF ELECTRODE FINGERS |
| EMBODIMENT | 21.1 μm | 19 | 400.9 | 18.6 μm | 19 | 353.4 |
| COMPARATIVE EXAMPLE 1 | 22.3 μm | 19 | 423.7 | 14.0 μm | 19 | 266.0 |
| COMPARATIVE EXAMPLE 2 | 21.1 μm | 19 | 400.9 | 18.6 μm | 19 | 353.4 |

| | POWER VALUE WHEN FILTER IS BROKEN DOWN |
|---|---|
| EMBODIMENT | 1250 mW |
| COMPARATIVE EXAMPLE 1 | 1250 mW |
| COMPARATIVE EXAMPLE 2 | 900 mW |

FILTER AND MULTIPLEXER

CROSS REFERENCE TO RELATED APPLICATIONS

This application claims the benefit of priority to Japanese Patent Application No. 2020-191178 filed on Nov. 17, 2020 and is a Continuation Application of PCT Application No. PCT/JP2021/041591 filed on Nov. 11, 2021. The entire contents of each application are hereby incorporated herein by reference.

BACKGROUND OF THE INVENTION

1. Field of the Invention

The present invention relates to a filter and a multiplexer including the filter.

2. Description of the Related Art

Filters that use predetermined frequency bands and pass bands have been known. As an example of filters of this type, a filter that includes a filter circuit and an additional circuit connected in parallel to the filter circuit is disclosed in Japanese Unexamined Patent Application Publication No. 2018-166340.

The filter disclosed in Japanese Unexamined Patent Application Publication No. 2018-166340 cancels unwanted waves outside the pass band by using the additional circuit. However, in this filter, a signal leakage path may be generated between a wire in the additional circuit and a wire in the filter circuit. Thus, there is a problem of not being able to ensure an attenuation outside the pass band of the filter.

SUMMARY OF THE INVENTION

Preferred embodiments of the present invention provide filters that each ensure an attenuation outside a pass band.

A filter according to a preferred embodiment of the present invention includes a first filter circuit operable in a first frequency band as a pass band and an additional circuit connected in parallel to at least a portion of the first filter circuit. The first filter circuit includes a resonator electrode on a substrate and a main wire connected to the resonator electrode. The main wire includes a first metal film on the substrate and a second metal film on the first metal film so as to be in contact with the first metal film. The additional circuit includes an IDT electrode group including a plurality of IDT electrodes on the substrate and a sub-wire on the substrate and connecting the IDT electrode group to the first filter circuit. At least a portion of the sub-wire includes a third metal film connected to the IDT electrode group. The third metal film is covered with a fourth metal film with an insulating layer interposed therebetween, the insulating layer being provided on the third metal film. The fourth metal film is connected to a ground terminal on the substrate.

Furthermore, a multiplexer according to a preferred embodiment of the present invention includes a first signal terminal and a second signal terminal, a filter according to a preferred embodiment of the present invention provided on a first path connecting the first signal terminal to the second signal terminal, a common terminal connected to the second signal terminal, a third signal terminal different from the first signal terminal, the second signal terminal, and the common terminal, and a second filter circuit having a pass band different from a pass band of the first filter circuit and provided on a second path connecting the common terminal to the third signal terminal.

According to preferred embodiments of the present invention, an attenuation outside the pass band of a filter can be ensured.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 9A is a plan view of a filter according to Comparative Example 1.

FIG. 14 is a diagram illustrating electrode parameters of IDT electrodes of additional circuits in filters according to a preferred embodiment of the present invention, Comparative Example 1, and Comparative Example 2.

FIG. 15 is a diagram illustrating electrode parameters of capacitance elements of the additional circuits in filters according to a preferred embodiment of the present invention, Comparative Example 1, and Comparative Example 2.

DETAILED DESCRIPTION OF THE PREFERRED EMBODIMENTS

Figure 1:
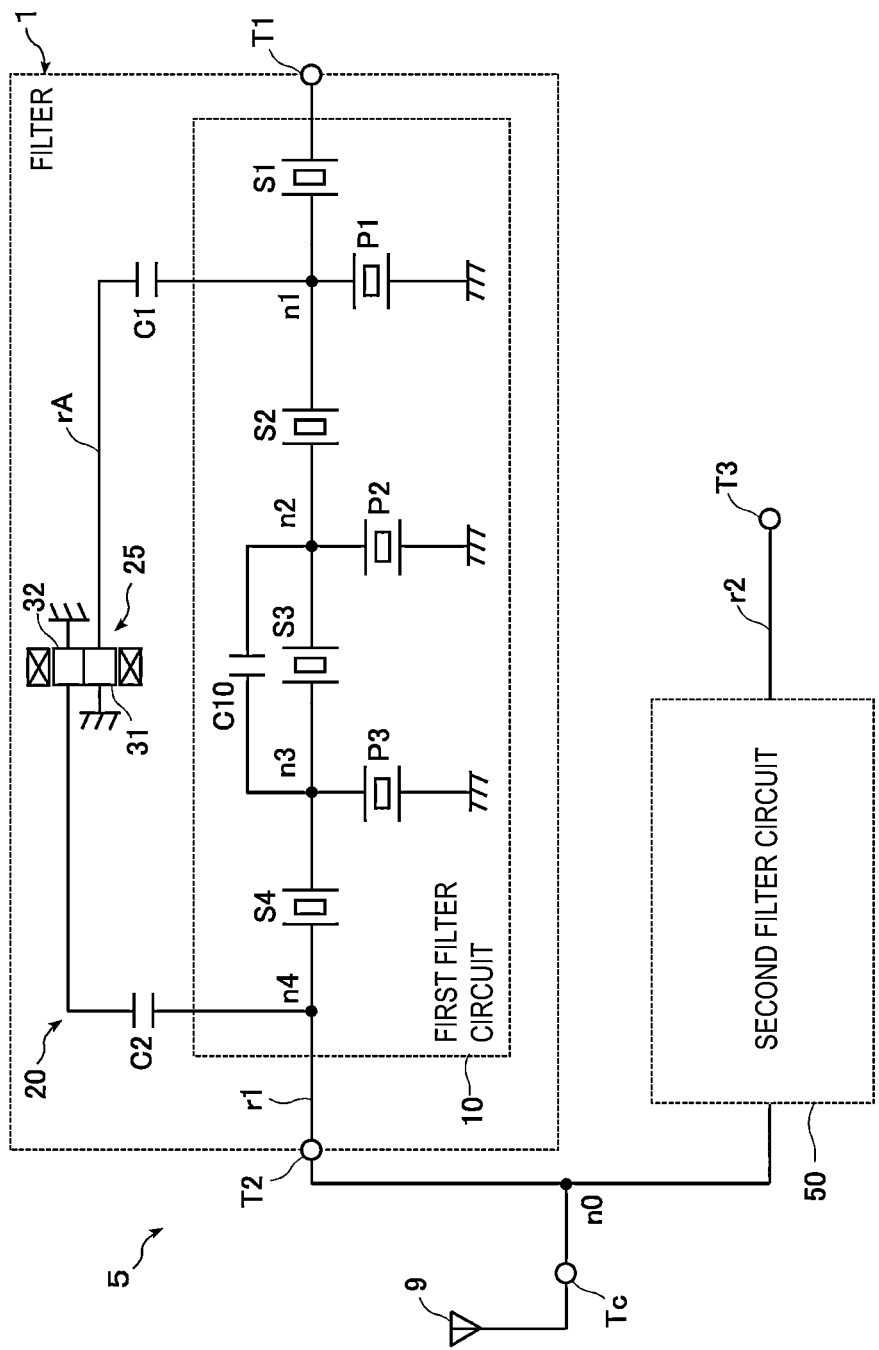
FIG. 1 is a circuit configuration diagram of a multiplexer including a filter according to a preferred embodiment of the present invention.

Hereinafter, preferred embodiments of the present invention will be described in detail with reference to drawings. The preferred embodiments described below each illustrate a comprehensive or specific example. The numerical values, shapes, materials, component elements, arrangements of the component elements, manners in which the component elements are connected, and so on illustrated in the preferred embodiments described below are merely examples and are not intended to limit the present invention. Among the component elements in the preferred embodiments described below, component elements that are not described in independent claims are described as arbitrary or optional component elements. In addition, the sizes of or the size ratios between the component elements illustrated in the drawings are not necessarily precise. In the drawings, the same or substantially the same components are denoted by the same reference signs, and duplicate description of those components may be omitted or simplified. Furthermore, in the preferred embodiments described below, "being connected" means being electrically connected with another element or the like interposed therebetween as well as being directly connected.

Preferred Embodiment

1. Configuration of Multiplexer

A configuration of a multiplexer including a filter according to a preferred embodiment of the present invention will be described with reference to FIG. 1.

FIG. 1 is a circuit configuration diagram of a multiplexer 5 including a filter 1 according to a preferred embodiment. In FIG. 1, an antenna element 9 is also illustrated.

The multiplexer 5 is, for example, a demultiplexer or a multiplexer including a plurality of filters having different pass bands. As illustrated in FIG. 1, the multiplexer 5 includes a filter 1 including a first filter circuit 10 and an additional circuit 20, and a second filter circuit 50. The multiplexer 5 also includes a first signal terminal T1, a second signal terminal T2, a third signal terminal T3, and a common terminal Tc.

The first signal terminal T1 is a terminal provided on first input/output side of the filter 1. The first signal terminal T1 is connected to an RF signal processing circuit (not illustrated in drawings) with an amplifying circuit or the like (not illustrated in drawings), which is provided outside the multiplexer 5, interposed therebetween.

The second signal terminal T2 is a terminal provided on a second input/output side of the filter 1. The second signal terminal T2 is connected to the common terminal Tc.

The common terminal Tc is a terminal connected to each of the filter 1 and the second filter circuit 50. Specifically, the common terminal Tc is connected to the filter 1 with a node n0, which is a connection node between the filter 1 and the second filter circuit 50, interposed therebetween and is connected to the second filter circuit 50 with the node n0 interposed therebetween. Furthermore, the common terminal Tc is connected to the antenna element 9, which is provided outside the multiplexer 5. The common terminal Tc also defines and functions as an antenna element of the multiplexer 5.

The third signal terminal T3 is a terminal different from the first signal terminal T1, the second signal terminal T2, and the common terminal Tc. The third signal terminal T3 is connected to the second filter circuit 50. Furthermore, the third signal terminal T3 is connected to an RF signal processing circuit (not illustrated in drawings) with an amplifying circuit or the like (not illustrated in drawings), which is provided outside the multiplexer 5, interposed therebetween.

The filter 1 is provided on a first path r1 that connects the first signal terminal T1 to the second signal terminal T2. The filter 1 is, for example, a transmission filter that uses an uplink frequency band (transmission band) as a pass band, and the pass band of the filter 1 is set to be lower than the pass band of the second filter circuit 50. The filter 1 includes the first filter circuit 10 that uses a first frequency band as a pass band and the additional circuit 20 that is additionally connected to the first filter circuit 10. The additional circuit 20 is a circuit for canceling unwanted waves outside the pass band of the first filter circuit 10. The additional circuit 20 will be described later.

The second filter circuit 50 is provided on a second path r2 that connects the common terminal Tc to the third signal terminal T3. The second filter circuit 50 has a pass band (second frequency band) different from the pass band of the first filter circuit 10. The second filter circuit 50 is, for example, a reception filter that uses a downlink frequency band (reception band) as a pass band.

The filter 1 and the second filter circuit 50 are required to have characteristics of transmitting predetermined frequency bands and attenuating bands outside the predetermined frequency bands.

2. Configuration of Filter

A configuration of the filter 1 will be described with reference to FIGS. 1 and 2.

As illustrated in FIG. 1, the filter 1 includes the first filter circuit 10 and the additional circuit 20.

The first filter circuit 10 includes series-arm resonators S1, S2, S3, and S4 and parallel-arm resonators P1, P2, and P3, which are, for example, acoustic wave resonators. Each of the series-arm resonators S1 to S4 and the parallel-arm resonators P1 to P3 includes, for example, an interdigital transducer (IDT) electrode provided on a substrate. The IDT electrodes of the series-arm resonators S1 to S4 and the parallel-arm resonators P1 to P3 are examples of resonator electrodes, which will be described later.

The series-arm resonators S1 to S4 are provided on the first path (series arms) r1 that connects the first signal terminal T1 to the second signal terminal T2. The series-arm resonators S1 to S4 are connected in series in this order from the first signal terminal T1 toward the second signal terminal T2.

The parallel-arm resonators P1 to P3 are connected in parallel on paths (parallel arms) that connect nodes n1, n2, and n3, which are arranged between the series-arm resonators S1 to S4 that are adjacent to each other on the first path r1, to the ground. Specifically, one end of the parallel-arm resonator P1 that is closest to the first signal terminal T1, of the parallel-arm resonators P1 to P3, is connected to the node n1 between the series-arm resonators S1 and S2, and the other end of the parallel-arm resonator P1 is connected to the ground. One end of the parallel-arm resonator P2 is connected to the node n2 between the series-arm resonators S2 and S3, and the other end of the parallel-arm resonator P2 is connected to the ground. One end of the parallel-arm resonator P3 is connected to the node n3 between the series-arm resonators S3 and S4, and the other end of the parallel-arm resonator P3 is connected to the ground. A bridging capacitance element C10 is connected in parallel to the series-arm resonator S3.

As described above, the first filter circuit 10 has, for example, a T-shape ladder filter structure including the four series-arm resonators S1 to S4 provided on the first path r1 and the three parallel-arm resonators P1 to P3 provided on the paths connecting the first path r1 to the ground.

The number of series-arm resonators and the number of parallel-arm resonators of the first filter circuit 10 are not limited to four and three, respectively. The number of series-arm resonators may be two or more and the number of parallel-arm resonators may be one or more. Furthermore, the parallel-arm resonators may be connected to the ground with inductors interposed therebetween.

Next, the additional circuit 20 of the filter 1 will be described. The additional circuit 20 is a circuit that applies an opposite phase to an unwanted wave outside the pass band generated in the first filter circuit 10 so that the unwanted wave is prevented from being output from the filter 1.

The additional circuit 20 is connected to different nodes n1 and n4 on the first path r1 such that the additional circuit 20 is connected in parallel to at least a portion of the first filter circuit 10. The node n4 is a connection node positioned between the series-arm resonator S4 and the second signal terminal T2. The additional circuit 20 is provided on a path bypassing a portion between the node n1 and the node n4 on the first path r1, that is, on an additional path rA that connects the node n1 to the node n4. The additional circuit 20 includes an IDT electrode group 25 and capacitance elements C1 and C2 that are arranged on the additional path rA.

The IDT electrode group 25 is electrically connected to the node n1 with the capacitance element C1 interposed therebetween and is electrically connected to the node n4 with the capacitance element C2 interposed therebetween. Furthermore, the node n1 and the node n4 are acoustically connected to each other with the IDT electrode group 25 interposed therebetween on the additional path rA.

Figure 2:
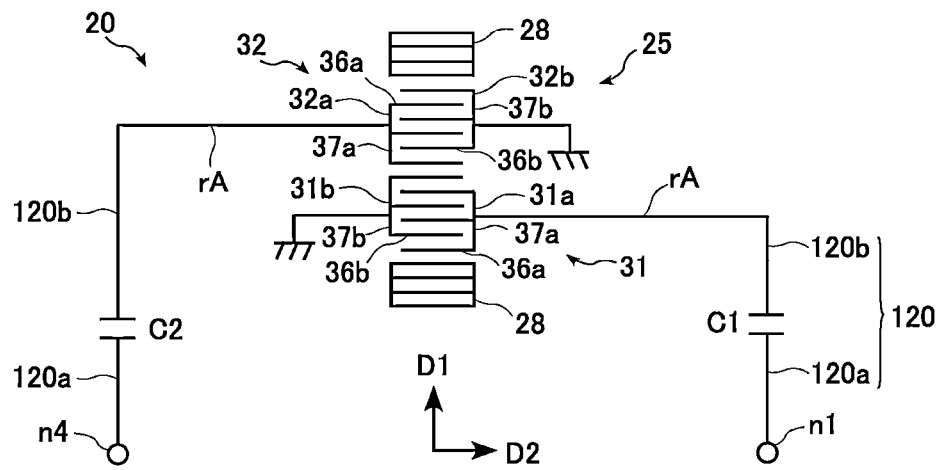
FIG. 2 is a schematic diagram illustrating an IDT electrode group included in an additional circuit of a filter according to a preferred embodiment of the present invention.

FIG. 2 is a schematic diagram illustrating the IDT electrode group 25 included in the additional circuit 20 of the filter 1. In FIG. 2, a plurality of reflectors 28 are also illustrated. The plurality of reflectors 28 are arranged in both outer side portions of the IDT electrode group 25 such that the IDT electrode group 25 is sandwiched between the reflectors 28 in an acoustic wave propagation direction D1. In FIG. 2, electrodes and wires are indicated by solid lines.

The IDT electrode group 25 is an acoustic wave resonator group including IDT electrodes 31 and 32. The IDT electrode group 25 is, for example, a longitudinally-coupled acoustic wave resonator. The IDT electrodes 31 and 32 are adjacent to each other along the acoustic wave propagation direction D1.

The IDT electrodes 31 and 32 include first comb-shaped electrodes 31a and 32a and second comb-shaped electrodes 31b and 32b. Of the IDT electrodes 31 and 32, the first IDT electrode 31 includes a pair of the first comb-shaped electrode 31a and the second comb-shaped electrode 31b that face each other. The second IDT electrode 32 includes a pair of the first comb-shaped electrode 32a and the second comb-shaped electrode 32b that face each other. The first comb-shaped electrode 31a and the second comb-shaped electrode 32b face towards the same direction and are arranged next to each other along the acoustic wave propagation direction D1 when the IDT electrodes 31 and 32 are viewed from a direction perpendicular or substantially perpendicular to a substrate 100 (see FIG. 3). Furthermore, the second comb-shaped electrode 31b and the first comb-shaped electrode 32a face towards the same or substantially the same direction and are arranged next to each other along the acoustic wave propagation direction D1.

3. Structure of IDT Electrode Group in Additional Circuit

A structure of the IDT electrode group 25 in the additional circuit 20 will be described with reference to FIG. 3. The IDT electrode group 25 includes, for example, a plurality of surface acoustic wave (SAW) resonators.

Figure 3:
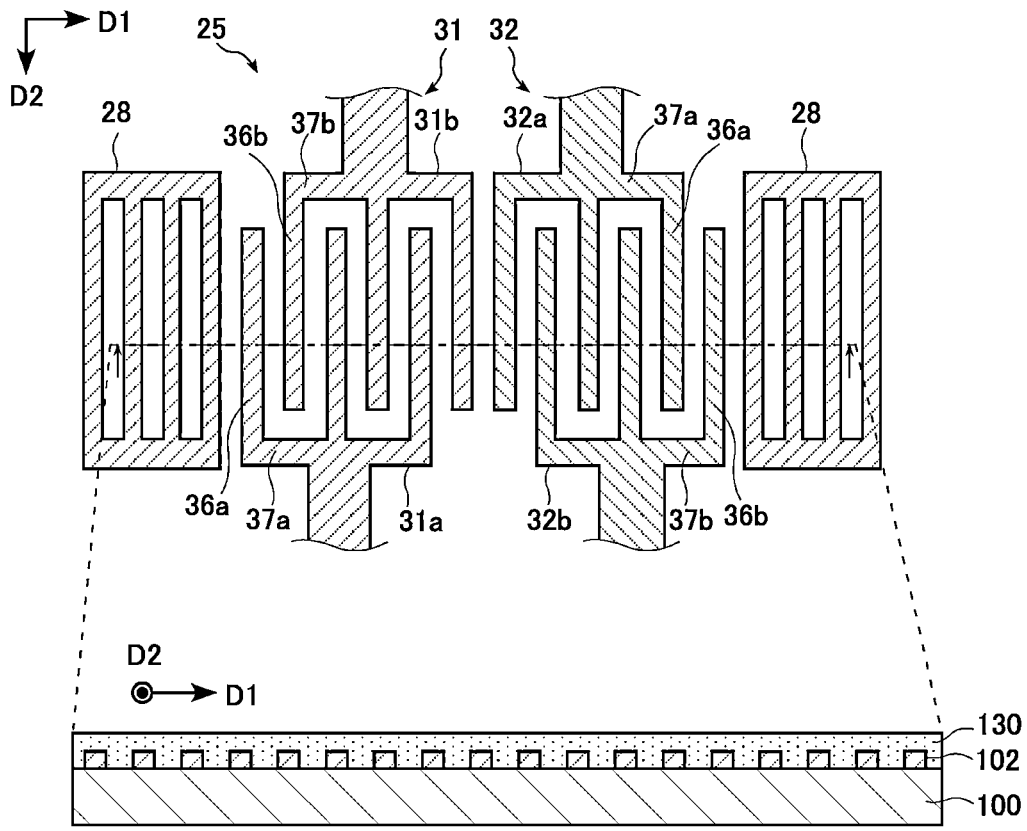
FIG. 3 includes a plan view and a cross-section view schematically illustrating a structure of the IDT electrode group illustrated in FIG. 2.

FIG. 3 includes a plan view and a cross-section view schematically illustrating a structure of the IDT electrode group 25. In FIG. 3, the two reflectors 28 are also illustrated. In FIG. 3, the IDT electrode group 25 is illustrated to explain a typical structure of a resonator, and the number of electrode fingers included in an IDT electrode and a reflector, lengths of the electrode fingers, and the like are not limited to those illustrated in FIG. 3.

The IDT electrode group 25 includes the substrate 100, which has piezoelectricity, and the IDT electrodes 31 and 32 that are provided on the substrate 100. As illustrated in the cross-section view in FIG. 3, the IDT electrode group 25 includes the substrate 100, an electrode layer 102 that defines the IDT electrodes 31 and 32, and an insulating layer 130 that is provided on the substrate 100 such that the insulating layer 130 covers the IDT electrodes 31 and 32.

The substrate 100 is, for example, an $LiNbO_3$ substrate (lithium niobate substrate) with a cut angle of about 127.5°. In the case where Rayleigh waves are used as acoustic waves propagating inside the substrate 100, the cut angle of the substrate 100 is preferably, for example, about 120°±20° or about 300°±20°.

The electrode layer 102 includes one metal film or a plurality of metal films. The structure of a metal film will be described later.

The insulating layer 130 is, for example, a dielectric film including silicon dioxide ($SiO_2$) as a main component. The insulating layer 130 is provided for the purpose of adjusting the frequency-temperature characteristics of the IDT electrode group 25, protecting the electrode layer 102 from external environment, or increasing moisture resistance.

As illustrated in the plan view of FIG. 3, the IDT electrode 31 includes the pair of the first comb-shaped electrode 31a and the second comb-shaped electrode 31b that face each other. The IDT electrode 32 includes the pair of the first comb-shaped electrode 32a and the second comb-shaped electrode 32b that face each other.

Each of the first comb-shaped electrodes 31a and 32a has a comb shape and includes a plurality of electrode fingers 36a that are parallel or substantially parallel to each other and a busbar electrode 37a that connects one ends of the plurality of electrode fingers 36a. Each of the second comb-shaped electrodes 31b and 32b has a comb shape and includes a plurality of electrode fingers 36b that are parallel or substantially parallel to each other and a busbar electrode 37b that connects one ends of the plurality of electrode fingers 36b. Each of the busbar electrodes 37a and 37b extends along the acoustic wave propagation direction D1. The plurality of electrode fingers 36a and 36b extend in an orthogonal direction D2 that is orthogonal or substantially orthogonal to the acoustic wave propagation direction D1. The plurality of electrode fingers 36a and 36b are interdigitated with each other in the orthogonal direction D2 and face each other in the acoustic wave propagation direction D1.

As illustrated in FIG. 2, the first comb-shaped electrodes 31a and 32a are electrically connected to the different nodes n1 and n4, respectively, on the first path r1. Specifically, the first comb-shaped electrode 31a is connected to the node n1 with a first additional path rA interposed therebetween, and the first comb-shaped electrode 32a is connected to the node n4 with a second additional path rA interposed therebetween. The second comb-shaped electrodes 31b and 32b is electrically connected to predetermined ground terminals.

The first comb-shaped electrodes 31a and 32a may be connected to nodes in both outer side positions of two or more series-arm resonators that are adjacent to each other on the first path r1. For example, the first comb-shaped electrode 31a may be connected to a node on the first path r1 that connects the first signal terminal T1 to the series-arm resonator S1 or may be connected to the node n2. For example, the first comb-shaped electrode 32a may be connected to the node n3.

4. Wiring Structure of Filter

A wiring structure of the filter 1 will be described with reference to FIGS. 4A to 8.

Figure 4A:
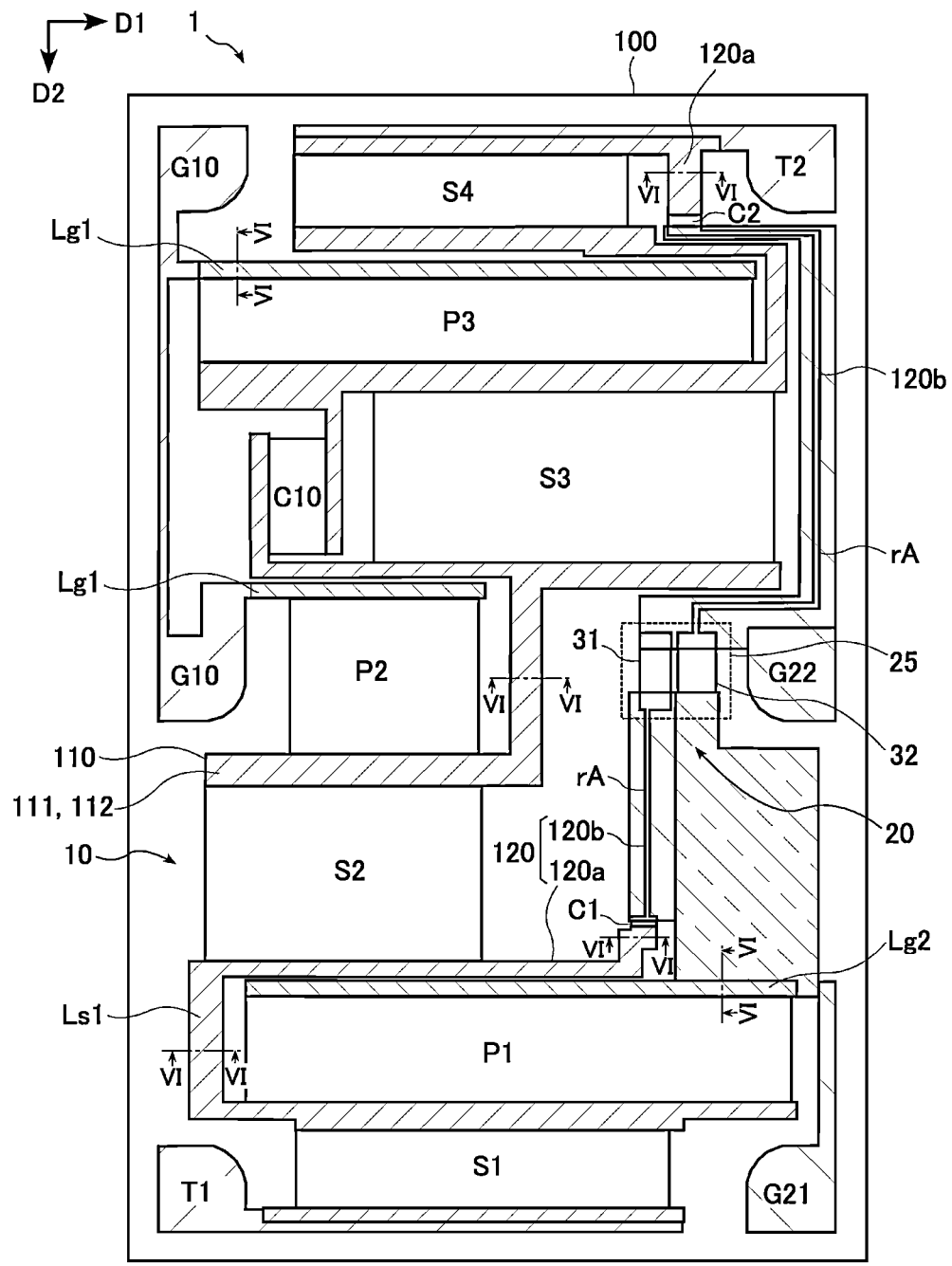
FIG. 4A is a plan view of a filter according to a preferred embodiment of the present invention.
Figure 4B:
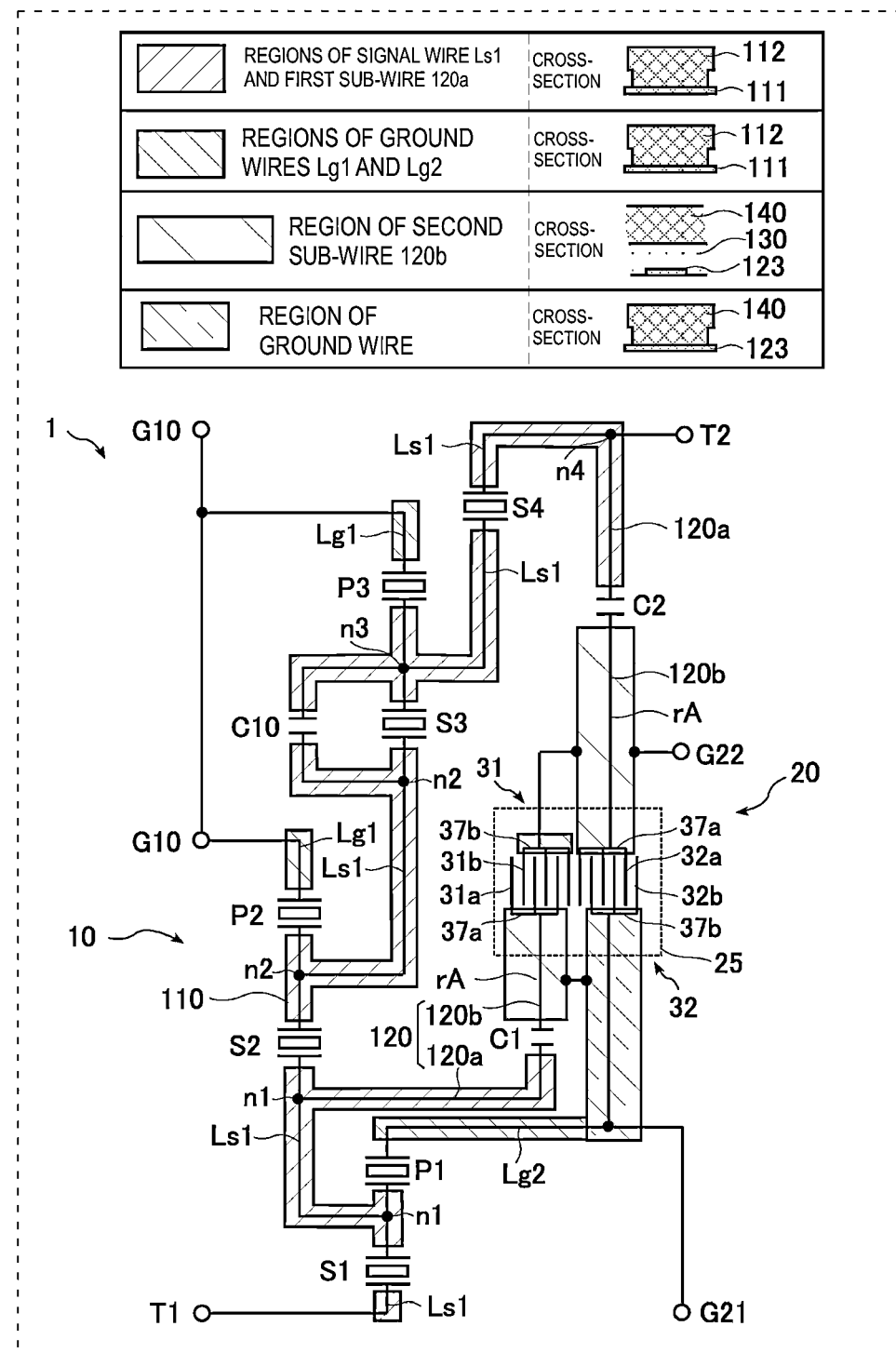
FIG. 4B is a diagram schematically illustrating wires in a filter according to a preferred embodiment of the present invention.
Figure 5:
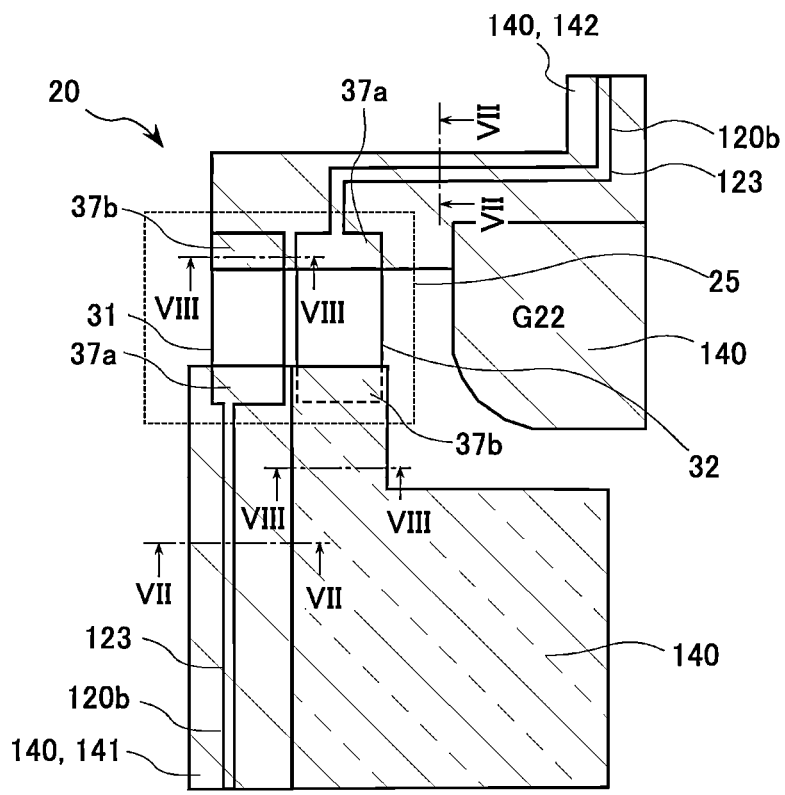
FIG. 5 is an enlarged view of a portion of the additional circuit in a filter according to a preferred embodiment of the present invention.

FIG. 4A is a plan view of the filter 1 according to a preferred embodiment of the present invention. FIG. 4B is a diagram schematically illustrating wires in the filter 1. FIG. 5 is an enlarged view of a portion of the additional circuit 20 in the filter 1. In FIG. 4B, a structure in the vicinity of wires is illustrated, and a structure of portions between adjacent wires is not illustrated. Furthermore, in these figures and the subsequent figures, illustration of the reflectors 28 are omitted.

As illustrated in FIGS. 4A and 4B, the filter 1 includes the first filter circuit 10 and the additional circuit 20. Furthermore, the filter 1 includes the first signal terminal T1 and the second signal terminal T2 to and from which signals are input and output, a plurality of ground terminals G10, a first ground terminal G21, and a second ground terminal G22. The plurality of ground terminals G10 are connected to each other by wires.

The first filter circuit 10 includes resonator electrodes provided on the substrate 100 and main wires 110 provided on the substrate 100.

The resonator electrodes are IDT electrodes defining the series-arm resonators S1 to S4 and the parallel-arm resonators P1 to P3 described above. The resonator electrodes include a first metal film 111, which will be described later, or the like.

The main wires 110 are wires connected to the resonator electrodes. The main wires 110 include a signal wire Ls1 through which a high frequency signal is transmitted, a ground wire Lg1 connected to a ground terminal G10, and a ground wire Lg2 connected to the ground terminal G21.

The signal wires Ls1 are wires that are positioned in a portion of an area between the first signal terminal T1 and the series-arm resonator S1, between the series-arm resonators S1 and S2, between the series-arm resonators S2 and S3, between the series-arm resonators S3 and S4, in a portion of an area between the series-arm resonator S4 and the second signal terminal T2, between the node n1 and the parallel-arm resonator P1, between the node n2 and the parallel-arm resonator P2, between the node n3 and the parallel-arm resonator P3, and between the bridging capacitance element C10 and the nodes n2 and n3. The ground wires Lg1 are wires that are positioned between the parallel-arm resonator P2 and the ground terminal G10 and between the parallel-arm resonator P3 and the ground terminal G10. The ground wire Lg2 is a wire that is positioned between the parallel-arm resonator P1 and the ground terminal G21.

Figure 6:
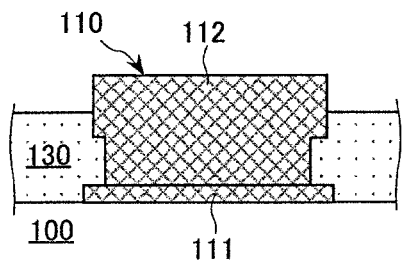
FIG. 6 is a cross-section view of a main wire and a first sub-wire in the filter according to a preferred embodiment of the present invention when viewed along line VI-VI illustrated in FIG. 4A.

FIG. 6 is a cross-section view of a main wire 110 and a first sub-wire 120a in the filter 1 when viewed along line VI-VI illustrated in FIG. 4A.

As illustrated in FIG. 6, the main wire 110 includes the first metal film 111 provided on the substrate 100 and a second metal film 112 provided on the first metal film 111 so as to be in contact with the first metal film 111. That is, the main wire 110 is a multilayer film formed by laminating the second metal film 112 over the first metal film 111.

As illustrated in FIGS. 4A and 4B, the additional circuit 20 includes the IDT electrode group 25 including the IDT electrodes 31 and 32 provided on the substrate 100, sub-wires 120 provided on the substrate 100, and the capacitance elements C1 and C2 provided on the substrate 100.

The IDT electrode group 25 includes the first IDT electrode 31 to and from which a signal is input and output and the second IDT electrode 32 to and from which a signal is input and output in a manner opposite to the manner in which a signal is input and output to and from the IDT electrode 31.

The capacitance elements C1 and C2 are provided on the additional paths rA that connect the IDT electrode group 25 to the first filter circuit 10. The first capacitance element C1, of the capacitance elements C1 and C2, is provided on the additional path rA that connects the first filter circuit 10 to the first IDT electrode 31. The second capacitance element C2, which is different from the first capacitance element C1, is provided on the additional path rA that connects the first filter circuit 10 to the second IDT electrode 32 of the IDT electrode group 25. Each of the capacitance elements C1 and C2 includes, for example, a pair of comb-shaped electrodes that face each other. The electrostatic capacitance of the capacitance element C1 is smaller than the electrostatic capacitance of the IDT electrode 31 to which the capacitance element C1 is connected, and the electrostatic capacitance of the capacitance element C2 is smaller than the electrostatic capacitance of the IDT electrode 32 to which the capacitance element C2 is connected.

The sub-wires 120 are wires that connect the IDT electrode group 25 to the first filter circuit 10. The sub-wires 120 include the first sub-wire 120a that is positioned near the first filter circuit 10 and a second sub-wire 120b that is positioned near the IDT electrode group 25, when viewed from the capacitance element C1 or C2. The first sub-wire 120a includes the first metal film 111 and the second metal film 112 (see FIG. 6). In contrast, the second sub-wire 120b includes a third metal film 123, as illustrated in FIG. 5. That is, at least a portion of the sub-wires 120 includes the third metal film 123 connected to the IDT electrode group 25.

Figure 7:
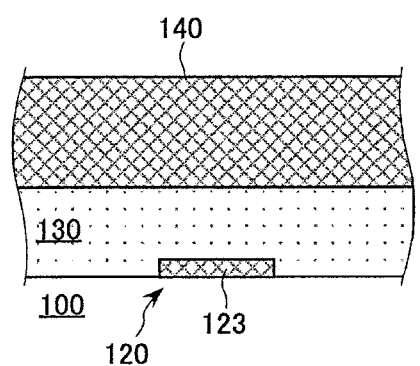
FIG. 7 is a cross-section view of a second sub-wire in the additional circuit when viewed along line VII-VII illustrated in FIG. 5.

FIG. 7 is a cross-section view of the second sub-wire 120b in the additional circuit 20 when viewed along line VII-VII illustrated in FIG. 5.

As illustrated in FIG. 7, the third metal film 123 is covered with a fourth metal film 140 with the insulating layer 130, which is provided on the third metal film 123, interposed therebetween. The insulating layer 130 is, for example, a layer made of a material including, for example, $SiO_2$. The insulating layer 130 electrically insulates the third metal film 123 and the fourth metal film 140 from each other. The fourth metal film 140 is a shielding film and is connected to a predetermined ground terminal provided at the substrate 100. The width of the fourth metal film 140 is wider than the width of the third metal film 123, and the fourth metal film 140 covers the third metal film 123 when viewed from a direction perpendicular or substantially perpendicular to the substrate 100. That is, a region in which the third metal film 123 is provided has a shield structure covered with the fourth metal film 140 defining and functioning as the ground.

As described above, the third metal film 123 of the second sub-wire 120b is covered with the fourth metal film 140 with the insulating layer 130 interposed therebetween. In contrast, the signal wire Ls1, the ground wires Lg1 and Lg2, and the first sub-wire 120a are not covered with the fourth metal film 140. In other words, the fourth metal film 140 covers neither the main wires 110 nor the first sub-wire 120a.

Figure 8:
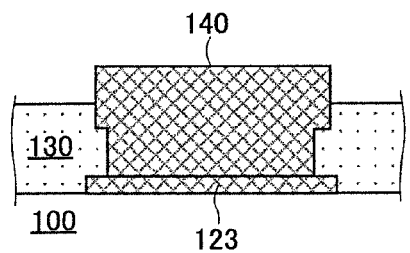
FIG. 8 is a cross-section view of a busbar electrode connected to a ground of an IDT electrode of the additional circuit when viewed along line VIII-VIII illustrated in FIG. 5.

FIG. 8 is a cross-section view of the busbar electrode 37b connected to the ground of the IDT electrodes 31 and 32 defining the additional circuit 20 when viewed along line VIII-VIII illustrated in FIG. 5.

As illustrated in FIG. 8, in the IDT electrodes 31 and 32, the busbar electrodes 37b connected to the ground includes the third metal film 123 provided on the substrate 100 and the fourth metal film 140 provided on the third metal film 123 so as to be in contact with the third metal film 123. That is, the busbar electrodes 37b are multilayer films formed by laminating the fourth metal film 140 over the third metal film 123.

The ground terminals G21 and G22 include the fourth metal film 140. Furthermore, the first signal terminal T1, the second signal terminal T2, and the ground terminals G10 include the second metal film 112. However, the first signal terminal T1, the second signal terminal T2, and the ground terminals G10 may include a multilayer film including the first metal film 111 and the second metal film 112.

A structure of each of the metal films will be described with reference to FIGS. 6 to 8.

The first metal film 111 and the third metal film 123 are metal films that are formed at the same time by a first photolithography step and are formed of the same material and with the same film thickness. The first metal film 111 and the third metal film 123 are provided at the same height position on the substrate 100 and are electrically connected to each other with an electrical element or the like interposed therebetween on the substrate 100. Each of the first metal film 111 and the third metal film 123 is formed by, for example, stacking an NiCr layer, a Pt layer, a Ti layer, and an AlCu layer in this order from the bottom. The film thickness of each of the first metal film 111 and the third metal film 123 is, for example, about 330 nm.

The second metal film 112 and the fourth metal film 140 are metal films that are formed at the same time by a second photolithography step after the first metal film 111 and the third metal film 123 are formed and are formed of the same material and with the same film thickness. The second metal film 112 and the fourth metal film 140 are provided at different height positions on the substrate 100. Each of the second metal film 112 and the fourth metal film 140 is formed by, for example, stacking a Ti layer, an AlCu layer, and a Ti layer in this order from the bottom. The film thickness of each of the second metal film 112 and the fourth metal film 140 is, for example, about 2520 nm.

The total sum of the film thickness of the first metal film 111 and the film thickness of the second metal film 112 is larger than the film thickness of the third metal film 123. Thus, the electrical resistance of the main wire 110 including the first metal film 111 and the second metal film 112 is lower than the electrical resistance of a portion of the sub-wire 120 including the third metal film 123.

Next, the relationship among ground terminals, fourth metal films, and comb-shaped electrodes will be described with reference to FIGS. 4A to 5.

The ground terminals include, in addition to the ground terminals G10, the first ground terminal G21 and the second ground terminal G22 that are not connected to each other. The first ground terminal G21 and the second ground terminal G22 are isolated from each other on the substrate 100 and are not electrically connected to each other.

The fourth metal film 140 includes a first fourth metal film 141 and a second fourth metal film 142 that are not connected to each other (see FIG. 5). The first fourth metal film 141 covers the third metal film 123 of the second sub-wire 120b that connects the first capacitance element C1 to the first IDT electrode 31 and is connected to the first ground terminal G21. The second fourth metal film 142 covers the third metal film 123 of the second sub-wire 120b that connects the second capacitance element C2 to the second IDT electrode 32 and is connected to the second ground terminal G22.

The busbar electrodes 37a of the first comb-shaped electrodes 31a and 32a, of the plurality of comb-shaped electrodes, that are connected to the third metal film 123 are covered with the fourth metal film 140 with the insulating layer 130, which is provided on the busbar electrodes 37a, interposed therebetween. Specifically, the fourth metal film 140 that covers the busbar electrode 37a of the first comb-shaped electrode 31a is the first fourth metal film 141 and is electrically connected to the first ground terminal G21. The fourth metal film 140 that covers the busbar electrode 37a of the first comb-shaped electrode 32a is the second fourth metal film 142 and is electrically connected to the second ground terminal G22.

Furthermore, the busbar electrodes 37b of the second comb-shaped electrodes 31b and 32b, of the plurality of comb-shaped electrodes, are connected to predetermined ground terminals. Specially, the busbar electrode 37b of the second comb-shaped electrode 31b is connected to the ground terminal G21, and the busbar electrode 37b of the second comb-shaped electrode 32b is connected to the ground terminal G22.

Furthermore, of the comb-shaped electrodes 31a and 32b that are adjacent to each other in the acoustic wave propagation direction D1, the first comb-shaped electrode 31a is connected to the first second sub-wire 120b including the third metal film 123, and the second comb-shaped electrode 32b is not connected to the second sub-wire 120b but is connected to the first ground terminal G21. Of the comb-shaped electrodes 31b and 32a that are adjacent to each other in the acoustic wave propagation direction D1, the first comb-shaped electrode 32a is connected to the second second sub-wire 120b including the third metal film 123, and the second comb-shaped electrode 31b is not connected to the second sub-wire 120b but is connected to the second ground terminal G22.

The wiring structure of the filter 1 will be described in an organized manner with reference to FIG. 4B. The signal wires Ls1 and the first sub-wires 120a in hatched regions with diagonal lines sloping upward to the right illustrated in FIG. 4B include the first metal film 111 and the second metal film 112. The ground wires Lg1 and Lg2 in hatched regions with diagonal lines sloping downward to the right are also include the first metal film 111 and the second metal film 112. The second sub-wires 120b indicated within hatched regions with wide diagonal lines include the third metal film 123. The third metal film 123 is covered with the fourth metal film 140 with the insulating layer 130 interposed therebetween, and the fourth metal film 140 is connected to predetermined ground terminals. The first signal terminal T1, the second signal terminal T2, and the ground terminals G10 include the second metal film 112. The ground terminals G21 and G22 include the fourth metal film 140.

As described above, in the filter 1 according to the present preferred embodiment, the third metal film 123 in the additional circuit 20 is covered with the fourth metal film 140 that is connected to the ground terminals G21 and G22. With this arrangement, capacitance coupling between wires in the additional circuit 20 and wires in the first filter circuit 10 can be reduced or prevented, and generation of a signal leakage path between the wires can be reduced or prevented. Thus, an attenuation outside the pass band of the filter can be ensured.

5. Method for Producing Wires and the Like

Next, a non-limiting example of a method for producing wires and the like will be described. Explanation of a method for producing busbar electrodes of resonator electrodes, the bridging capacitance element C10, and the capacitance elements C1 and C2 will be omitted.

As described above, each of the signal wires Ls1 and the ground wires Lg1 and Lg2 include a multilayer film including the first metal film 111 and the second metal film 112. Each of the first sub-wire 120a that is positioned between the node n1 and the capacitance element C1 and the first sub-wire 120a that is positioned between the node n4 and the capacitance element C2 also includes a multilayer film including the first metal film 111 and the second metal film 112. Each of the second sub-wire 120b that connects the capacitance element C1 to the IDT electrode 31 and the second sub-wire 120b that connects the capacitance element C2 to the IDT electrode 32 includes the third metal film 123.

First, the first metal film 111 and the third metal film 123 are formed at the same time on the substrate 100 in the first photolithography step. Specifically, the first metal film 111, which defines a lower layer of the main wires 110 and the first sub-wires 120a, and the third metal film 123, which defines a lower layer of the second sub-wires 120b, are formed on the substrate 100. At this time, resonator electrodes may be formed of the first metal film 111. Furthermore, the IDT electrodes 31 and 32 may be formed of the third metal film 123.

Next, the insulating layer 130 is formed so as to cover the first metal film 111 and the third metal film 123. At this time, the resonator electrodes and the IDT electrodes 31 and 32 are also covered with the insulating layer 130.

Next, the insulating layer 130 that is above the first metal film 111 defining the main wires 110 and the first sub-wires 120a is removed by, for example, etching or the like. At this time, the insulating layer 130 that is above the busbar electrodes 37b connected to the ground of the IDT electrodes 31 and 32 is also removed. The insulating layer 130 that is above the third metal film 123 defining the second sub-wires 120b is not removed.

Next, the second metal film 112 and the fourth metal film 140 are formed at the same time in the second photolithography step. Specifically, the second metal film 112 is laminated over the first metal film 111. In contrast, the fourth metal film 140 is laminated over the third metal film 123 with the insulating layer 130 interposed therebetween. Furthermore, the fourth metal film 140 is also laminated over the busbar electrodes 37b of the IDT electrodes 31 and 32. The first signal terminal T1 and the second signal terminal T2 may be formed of the second metal film, and the ground terminals G10 and the ground terminals G21 and G22 may be formed of the fourth metal film 140.

With the example of a producing method described above, the signal wires Ls1, the ground wires Lg1 and Lg2, the first sub-wires 120a, and the second sub-wires 120b are formed on the substrate 100. The fourth metal film 140 is formed on the third metal film 123, which configures the second sub-wires 120b, with the insulating layer 130 interposed therebetween. Thus, the second sub-wire 120b is a wire having a shield structure.

6. Advantageous Effects and the Like

Advantageous effects and the like of the filter 1 according to the present preferred embodiment will be described with comparison to Comparative Example 1 and Comparative Example 2. Comparative Example 1 and Comparative Example 2 are illustrated for the purpose of clarification of differences from a specific preferred embodiment and are not related arts.

First, configurations of filters according to Comparative Example 1 and Comparative Example 2 will be described.

Figure 9B:
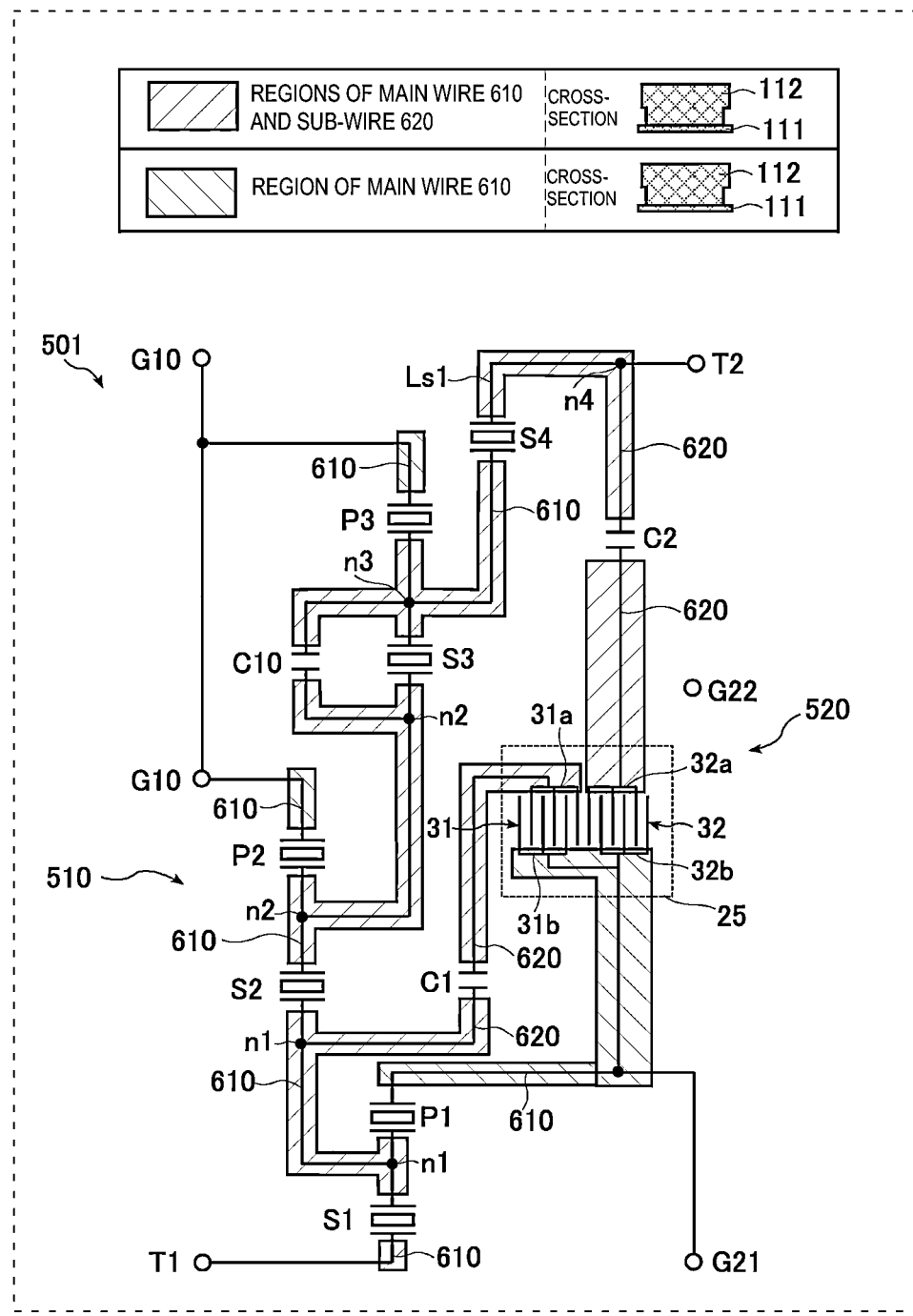
FIG. 9B is a diagram schematically illustrating wires in the filter according to Comparative Example 1.
Figure 10:
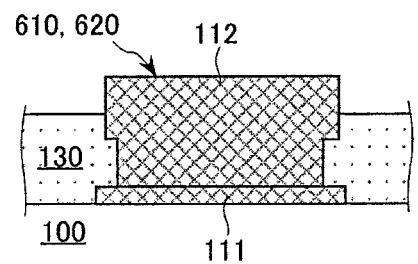
FIG. 10 is a cross-section view of a wire in the filter according to Comparative Example 1 when viewed along line X-X illustrated in FIG. 9A.

FIG. 9A is a plan view of a filter 501 according to Comparative Example 1. FIG. 9B is a diagram schematically illustrating wires in the filter 501. FIG. 10 is a cross-section view of a wire in the filter 501 when viewed along line X-X illustrated in FIG. 9A.

In the filter 501 according to Comparative Example 1, both main wires 610 in a first filter circuit 510 and sub-wires 620 in an additional circuit 520 include the first metal film 111 and the second metal film 112. That is, Comparative Example 1 is different from a preferred embodiment of the present invention in that the sub-wires 620 in the additional circuit 520 do not include a shield structure.

Furthermore, in the additional circuit 520 according to Comparative Example 1, as illustrated in FIG. 9B, the first comb-shaped electrodes 31a and 32a that are adjacent to each other in the acoustic wave propagation direction D1 are connected to the corresponding sub-wires 620, and both the second comb-shaped electrodes 31b and 32b that are adjacent to each other in the acoustic wave propagation direction D1 are connected to the first ground terminal G21. That is, Comparative Example 1 is also different from the present preferred embodiment in that the second comb-shaped electrodes 31b and 32b are not connected to different ground terminals.

Figure 11A:
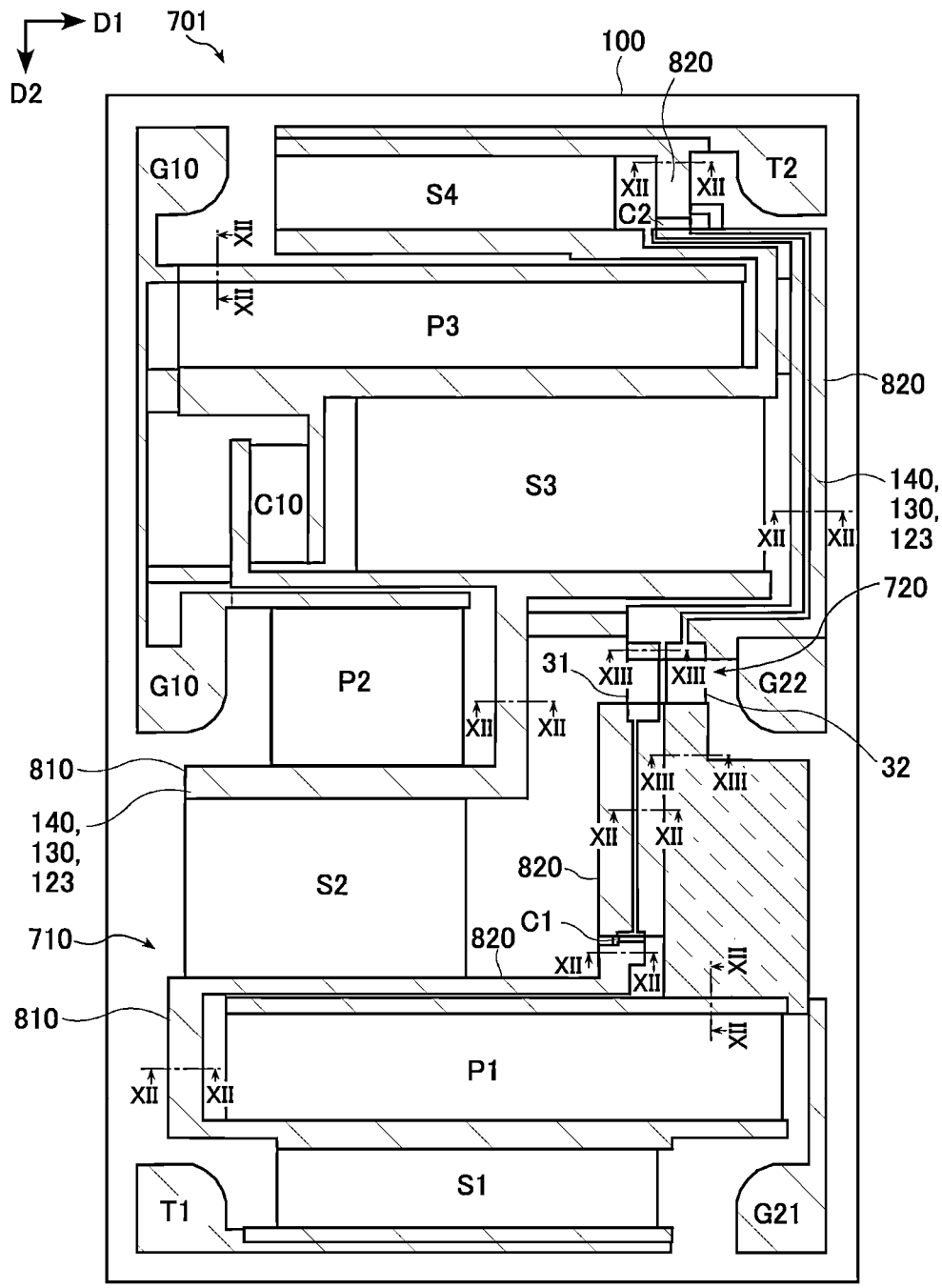
FIG. 11A is a plan view of a filter according to Comparative Example 2.
Figure 11B:
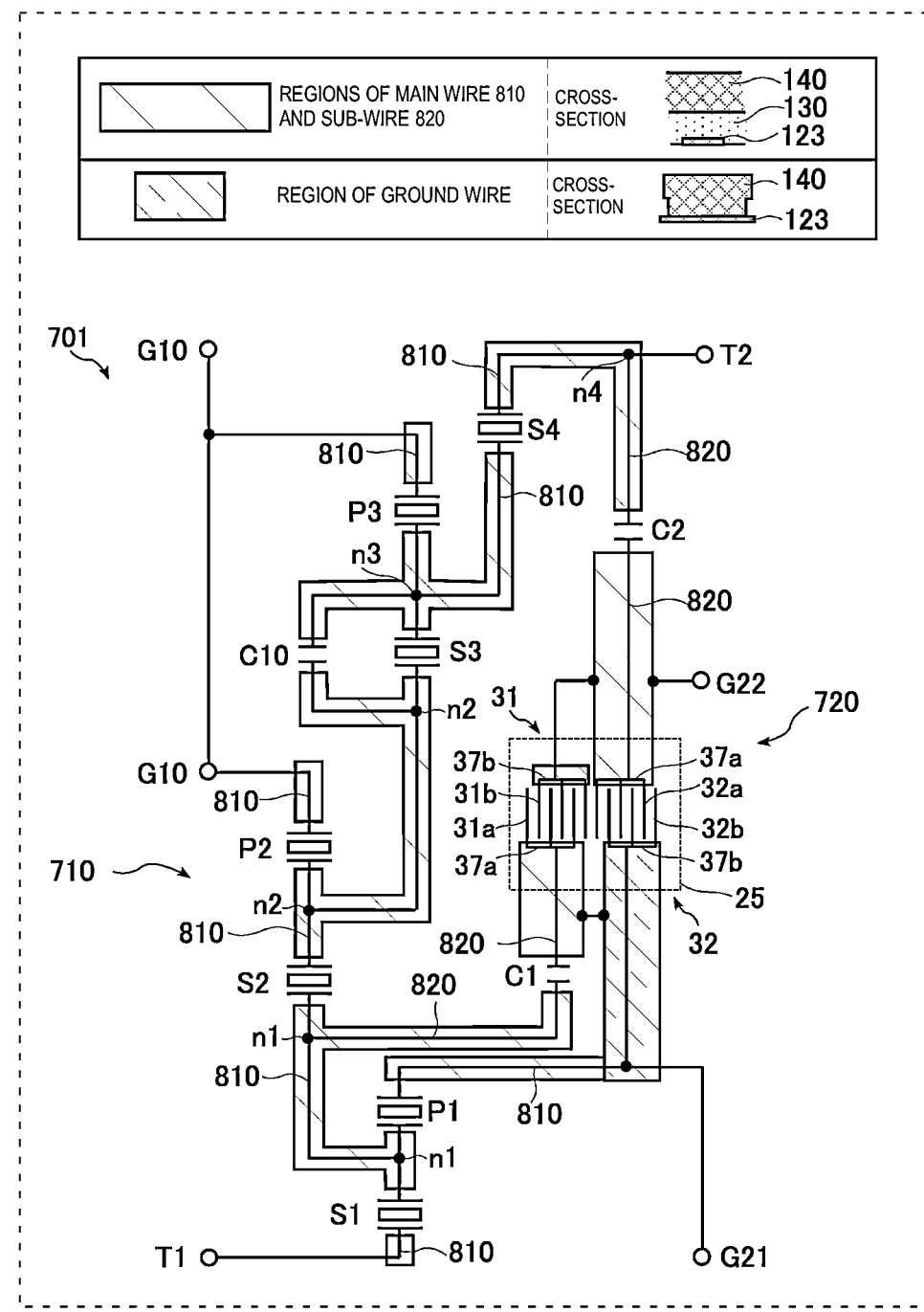
FIG. 11B is a diagram schematically illustrating wires in the filter according to Comparative Example 2.
Figure 12:
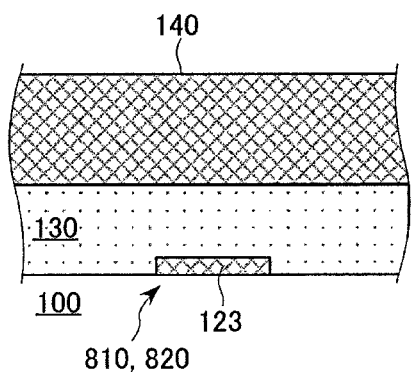
FIG. 12 is a cross-section view of a wire in the filter according to Comparative Example 2 when viewed along line XII-XII illustrated in FIG. 11A.
Figure 13:
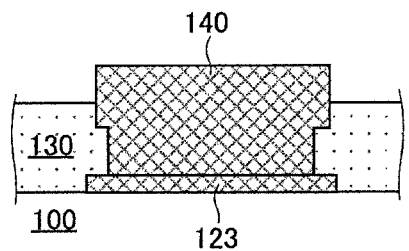
FIG. 13 is a cross-section view of a wire in the filter according to Comparative Example 2 when viewed along line XIII-XIII illustrated in FIG. 11A.

FIG. 11A is a plan view of a filter 701 according to Comparative Example 2. FIG. 11B is a diagram schematically illustrating wires in the filter 701. FIG. 12 is a cross-section view of a wire in the filter 701 when viewed along line XII-XII illustrated in FIG. 11A. FIG. 13 is a cross-section view of a wire in the filter 701 when viewed along line XIII-XIII illustrated in FIG. 11A.

In the filter 701 according to Comparative Example 2, both main wires 810 in a first filter circuit 710 and sub-wires 820 in an additional circuit 720 include the third metal film 123, and the third metal film 123 is covered with the fourth metal film 140 with the insulating layer 130 interposed therebetween. That is, Comparative Example 2 is different from a preferred embodiment of the present invention in that the first filter circuit 710 also has a shield structure.

Next, electrode parameters of the IDT electrodes 31 and 32 and electrode parameters of the capacitance elements C1 and C2 that define additional circuits according to a preferred embodiment, Comparative Example 1, and Comparative Example 2 will be explained.

FIG. 14 is a diagram illustrating electrode parameters of IDT electrodes configuring additional circuits in the filters according to the present preferred embodiment, Comparative Example 1, and Comparative Example 2. FIG. 15 is a diagram illustrating electrode parameters of capacitance elements defining the additional circuits in the filters according to the present preferred embodiment, Comparative Example 1, and Comparative Example 2. In FIG. 14, the intersecting widths and the numbers of electrode fingers of the IDT electrodes 31 and 32 are illustrated. In FIG. 15, the intersecting widths and the numbers of electrode fingers of pairs of comb-shaped electrodes defining the capacitance elements are illustrated. The electrostatic capacitance of a pair of comb-shaped electrodes is proportional to the product of the intersecting width and the number of electrode fingers. Thus, the electrostatic capacitance of the capacitance element C1 is smaller than the electrostatic capacitance of the IDT electrode 31, and the electrostatic capacitance of the capacitance element C2 is smaller than the electrostatic capacitance of the IDT electrode 32.

Next, bandpass characteristics of the filters according to the present preferred embodiment, Comparative Example 1, and Comparative Example 2 will be described with reference to FIG. 16.

Figures 16, 17:
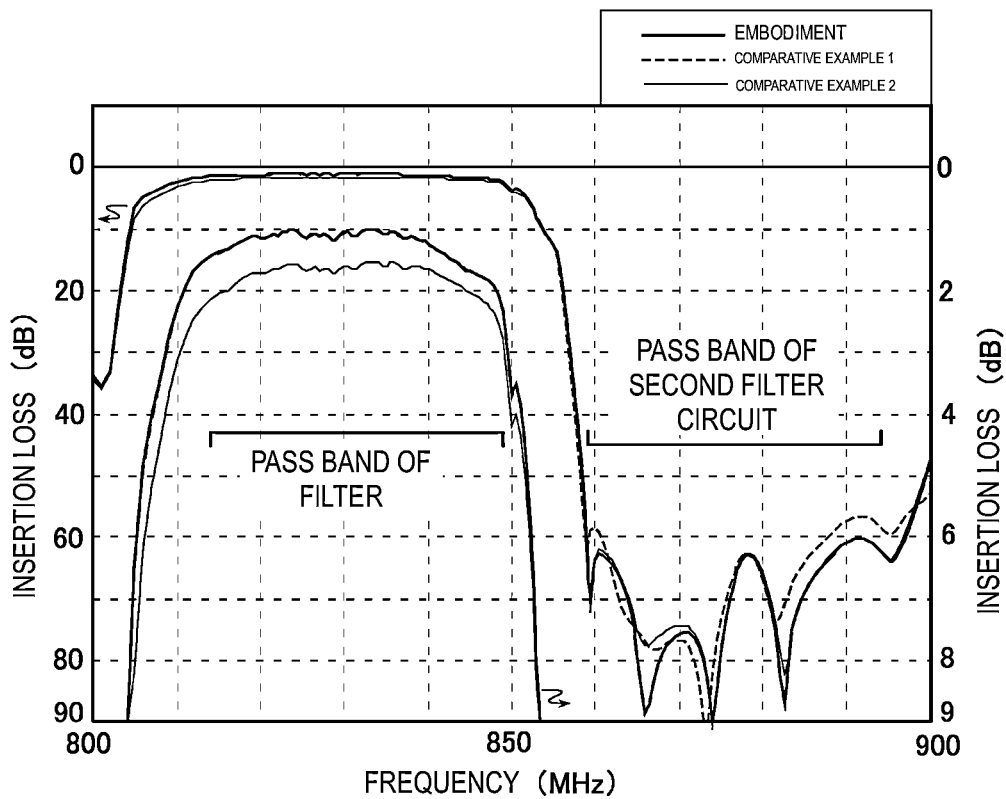
FIG. 16 is a diagram illustrating bandpass characteristics of filters according to a preferred embodiment of the present invention, Comparative Example 1, and Comparative Example 2.
FIG. 17 is a diagram illustrating electric power handling capability of filters according to a preferred embodiment of the present invention, Comparative Example 1, and Comparative Example 2.

FIG. 16 is a diagram illustrating bandpass characteristics of the filters according to the present preferred embodiment, Comparative Example 1, and Comparative Example 2. In FIG. 16, an example in which a filter is used as a transmission filter and the second filter circuit 50 is used as a reception filter is illustrated. Furthermore, in FIG. 16, an example in which the pass band of the transmission filter ranges from about 814 MHz to about 849 MHz and the pass band of the reception filter ranges from about 859 MHz to about 894 MHz is illustrated.

As illustrated in FIG. 16, insertion loss outside the pass band of each of the filters according to the present preferred embodiment and Comparative Example 2 is about 60.2 dB, and insertion loss outside the pass band of the filter according to Comparative Example 1 is about 56.7 dB. As described above, a sufficient attenuation can be ensured outside the pass band of the filter according to the present preferred embodiment compared to outside the pass band of the filter according to Comparative Example 1.

Furthermore, as illustrated in FIG. 16, insertion loss in the pass band of each of the filters according to the present preferred embodiment and Comparative Example 1 is about 2.3 dB, and insertion loss in the pass band of the filter according to Comparative Example 2 is about 2.8 dB. As described above, insertion loss in the pass band of the filter according to the present preferred embodiment is smaller than insertion loss in the pass band of the filter according to Comparative Example 2.

Next, electric power handling capability of filters will be described with reference to FIG. 17.

FIG. 17 is a diagram illustrating electric power handling capability of the filters according to the present preferred embodiment, Comparative Example 1, and Comparative Example 2. In FIG. 17, power values when high power is applied in a step-up manner to the first signal terminals T1 of the filters (high voltage is applied between the first signal terminal T1 and the second signal terminal T2) and the filters are broken down are illustrated. As illustrated in FIG. 17, the filters according to the present preferred embodiment and Comparative Example 1 are broken down when the power value is about 1250 mW, and the filter according to Comparative Example 2 is broken down when the power value is about 900 mW. As described above, electric power handling capability in the present preferred embodiment is higher than electric power handling capability in Comparative Example 2.

That is, in a comprehensive evaluation regarding attenuation characteristics outside the pass band, loss in the pass band, and electric power handling capability, the present preferred embodiment is more excellent than Comparative Example 1 and Comparative Example 2.

For example, in the case where unwanted waves are canceled using an additional circuit, the additional circuit is arranged such that the additional circuit is connected in parallel to a first filter circuit and signal wires in the first filter circuit and signal wires in the additional circuit are close to each other. In this case, capacitance coupling occurs between the signal wires in the first filter circuit and the signal wires in the additional circuit, and a portion of signals flowing in the first filter circuit may be leaked towards the additional circuit. Thus, a problem occurs in which a cancellation operation in the additional circuit is impeded and an attenuation outside the pass band of the filter cannot be ensured.

In contrast, in the filter 1 according to the present preferred embodiment, the third metal film 123, which is at least a portion of the wires in the additional circuit 20, is covered with the fourth metal film 140 connected to the ground. Thus, at least a portion of the wires in the additional circuit 20 includes a shield structure, and capacitance coupling between the wires in the additional circuit 20 and the wires in the first filter circuit 10 can be reduced or prevented. Therefore, compared to Comparative Example 1 not including a shield structure, an attenuation outside the pass band can be ensured.

Furthermore, in the filter 1 according to the present preferred embodiment, the main wires 110 in the first filter circuit 10 include a multilayer film including the first metal film 111 and the second metal film 112. For example, in the filter 701 according to Comparative Example 2, the main wires 110 are covered with the fourth metal film 140 connected to the ground. Thus, a capacitance component easily enters the main wires 110. If a capacitance component enters a main wire 110, impedance is shifted, and insertion loss in the pass band of the filter 701 occurs. In contrast, in the filter 1 according to the present preferred embodiment, the main wires 110 are not covered with the fourth metal film 140. Thus, a capacitance component is less likely to enter the main wires 110. Therefore, impedance is less likely to be shifted, and occurrence of insertion loss in the pass band of the filter 701 can be reduced or prevented.

Furthermore, since the filter 1 according to the present preferred embodiment includes a multilayer film including the first metal film 111 and the second metal film 112, wiring resistance of the main wires 110 in the first filter circuit 10 is low. Thus, compared to Comparative Example 2 in which the main wires 610 in the first filter circuit 510 also include a shield structure, wiring loss can be reduced. Therefore, the occurrence of insertion loss in the pass band of the filter 1 can be reduced or prevented.

Conclusion

As described above, the filter 1 according to a preferred embodiment of the present invention includes the first filter circuit 10 that uses a first frequency band as a pass band and the additional circuit 20 that is connected in parallel to at least a portion of the first filter circuit 10. The first filter circuit 10 includes a resonator electrode that is provided on the substrate 100 and a main wire 110 that is connected to the resonator electrode. The main wire 110 includes the first metal film 111 provided on the substrate 100 and the second metal film 112 provided on the first metal film 111 so as to be in contact with the first metal film 111. The additional circuit 20 includes the IDT electrode group 25 including the IDT electrodes 31 and 32 that are provided on the substrate 100 and the sub-wire 120 that is provided on the substrate 100 and connects the IDT electrode group 25 to the first filter circuit 10. At least a portion of the sub-wire 120 includes the third metal film 123 that is connected to the IDT electrode group 25. The third metal film 123 is covered with the fourth metal film 140 with the insulating layer 130 interposed therebetween, the insulating layer 130 being provided on the third metal film 123. The fourth metal film 140 is connected to a ground terminal that is provided on the substrate 100.

As described above, the third metal film 123 in the additional circuit 20 is covered with the fourth metal film 140 that is connected to the ground terminal (for example, the ground terminals G21 and G22). With this arrangement, capacitance coupling between a wire in the additional circuit 20 and a wire in the first filter circuit 10 can be reduced or prevented, and generation of a signal leakage path between the wires can be reduced or prevented. Thus, an attenuation outside the pass band of the filter 1 can be ensured.

Furthermore, the fourth metal film 140 does not necessarily cover the main wire 110 and may cover the third metal film 123 when viewed from a direction perpendicular or substantially perpendicular to the substrate 100.

For example, if the main wires 110 are covered with the fourth metal film 140 connected to the ground, a capacitance component easily enters the main wires 110. Thus, impedance is shifted, and insertion loss in the pass band of the filter occurs. In the filter 1 according to the present preferred embodiment, the main wires 110 are not covered with the fourth metal film 140. Thus, a capacitance component is less likely to enter the main wires 110, and impedance is less likely to be shifted. Therefore, occurrence of insertion loss in the pass band of the filter 1 can be reduced or prevented.

Furthermore, the total sum of the film thickness of the first metal film 111 and the film thickness of the second metal film 112 may be larger than the film thickness of the third metal film 123.

With this arrangement, wiring resistance of the main wire 110 that includes the first metal film 111 and the second metal film 112 can be reduced, and wiring loss can be reduced. Thus, occurrence of insertion loss in the pass band of the filter 1 can be reduced or prevented. Furthermore, even in the case where high power is applied to the filter 1, melt-cutting of the main wire 110 or breakage of the first filter circuit 10 can be reduced or prevented.

Furthermore, the first metal film 111 and the third metal film 123 may be metal films that are formed at the same time with the same film thickness and may be provided at the same height position on the substrate 100. The second metal film 112 and the fourth metal film 140 may be metal films that are formed at the same time with the same film thickness after the first metal film 111 and the third metal film 123 are formed and may be provided at different height positions on the substrate 100.

As described above, the wires in the filter 1 include the first metal film 111 and the third metal film 123, which are formed at the same time, and the second metal film 112 and the fourth metal film 140, which are formed at the same time. Thus, production cost of the filter 1 can be reduced.

Furthermore, the additional circuit 20 may further include at least one capacitance element C1 (or C2) that is provided on the additional path rA connecting the first filter circuit 10 to the IDT electrode group 25. The sub-wire 120 on the additional path rA may include the first sub-wire 120*a* that connects the first filter circuit 10 to the capacitance element C1 and the second sub-wire 120*b* that connects the capacitance element C1 to the IDT electrode group 25. The first sub-wire 120*a* may include the first metal film 111 and the second metal film 112 and is not necessarily covered with the fourth metal film 140. The second sub-wire 120*b* may include the third metal film 123 and may be covered with the fourth metal film 140 with the insulating layer 130 interposed therebetween.

As described above, the second sub-wire 120*b* is covered with the fourth metal film 140 defining and functioning as the ground. Thus, capacitance coupling between the second sub-wire 120*b* and the main wire 110 can be reduced or prevented, and generation of a signal leakage path between the wires can be reduced or prevented. Therefore, an attenuation outside the pass band of the filter 1 can be ensured. Furthermore, since the first sub-wire 120*a* includes the first metal film 111 and the second metal film 112, wiring resistance of the first sub-wire 120*a* can be reduced, and wiring loss can be reduced. Therefore, occurrence of insertion loss in the pass band of the filter 1 can be reduced or prevented. Furthermore, even in the case where high power is applied to the additional circuit 20, breakage of the additional circuit 20 can be reduced or prevented.

Furthermore, the additional circuit 20 may include the capacitance elements C1 and C2. The IDT electrode group 25 may include the first IDT electrode 31 to and from which a signal is input and output and the second IDT electrode 32 to and from which a signal is input and output in a manner opposite to the manner in which a signal is input and output to and from the first IDT electrode 31. Of the capacitance elements C1 and C2, the first capacitance element C1 may be provided on the additional path rA that connects the first filter circuit 10 to the first IDT electrode 31, and the second capacitance element C2 that is different from the first capacitance element C1 may be provided on the additional path rA that connects the first filter circuit 10 to the second IDT electrode 32.

With this arrangement, the second sub-wire 120*b* is connected to the first filter circuit 10 with the capacitance elements C1 and C2 interposed therebetween. Thus, even in the case where high power is applied to the filter 1, current is reduced by passing through the capacitance elements C1 and C2, and melt-cutting of the second sub-wire 120*b* in the additional circuit 20 can be reduced or prevented. Furthermore, since melt-cutting of the second sub-wire 120*b* can be reduced or prevented, the second sub-wire 120*b* can include the third metal film 123 and can include a shield structure covered with the fourth metal film 140. Thus, an attenuation outside the pass band of the filter 1 can be ensured.

Furthermore, the ground terminal may include the first ground terminal G21 and the second ground terminal G22 that are not connected to each other. The fourth metal film 140 may include the first fourth metal film 141 and the second fourth metal film 142 that are not connected to each other. The first fourth metal film 141 may cover the third metal film 123 of the second sub-wire 120*b* that connects the first capacitance element C1 to the first IDT electrode 31 and may be connected to the first ground terminal G21. The second fourth metal film 142 may cover the third metal film 123 of the second sub-wire 120b that connects the second capacitance element C2 to the second IDT electrode 32 and may be connected to the second ground terminal G22.

As described above, since the fourth metal films 141 and 142 that are electrically isolated from each other are connected to the ground terminals G21 and G22 that are electrically isolated from each other, capacitance coupling between the second sub-wire 120b connected to the first IDT electrode 31 and the second sub-wire 120b connected to the second IDT electrode 32 can be reduced or prevented. Accordingly, signal leakage between the second sub-wire 120b connected to the IDT electrode 31 and the second sub-wire 120b connected to the IDT electrode 32 can be reduced or prevented. Therefore, an attenuation outside the pass band of the filter 1 can be ensured.

Furthermore, electrostatic capacitance of the capacitance element C1 (or C2) may be smaller than electrostatic capacitance of the IDT electrode 31 (or 32).

For example, amplitude characteristics required for the additional circuit 20 to cancel unwanted waves are determined, and the amplitude characteristics are adjusted based on the total electrostatic capacitance of the capacitance elements C1 and C2 and the IDT electrode group 25. Thus, when the electrostatic capacitance of the IDT electrode group 25 is increased, the electrostatic capacitance required for the capacitance elements C1 and C2 can be reduced by the amount of the increase of the electrostatic capacitance of the IDT electrode group 25. As in the present preferred embodiment, by reducing the electrostatic capacitance of the capacitance element C1 (or C2) to be smaller than the electrostatic capacitance of the IDT electrode 31 (or 32), current flowing in the sub-wire 120 can be reduced, and melt-cutting of the second sub-wire 120b can thus be reduced or prevented. Furthermore, since melt-cutting of the second sub-wire 120b can be reduced or prevented, the second sub-wire 120b can include the third metal film 123 and can include a shield structure covered with the fourth metal film 140. Thus, an attenuation outside the pass band of the filter 1 can be ensured.

Furthermore, each of the IDT electrodes 31 and 32 may include a plurality of comb-shaped electrodes that face each other. Each of the plurality of comb-shaped electrodes may include the electrode fingers 36a and 36b that intersect in the acoustic wave propagation direction D1 and the busbar electrodes 37a and 37b that are connected to one ends of the electrode fingers 36a and 36b. Out of the plurality of comb-shaped electrodes, the busbar electrodes 37a of the comb-shaped electrodes 31a and 32a that are connected to the second sub-wire 120b may be covered with the fourth metal film 140 with the insulating layer 130 interposed therebetween, the insulating layer 130 being provided on the busbar electrodes 37a.

As described above, since the busbar electrodes 37a of the comb-shaped electrodes 31a and 32a are covered with the fourth metal film 140, capacitance coupling between the busbar electrode 37a of the comb-shaped electrode 31a and the busbar electrode 37a of the comb-shaped electrode 32a can thus be reduced or prevented. Thus, signal leakage between the two busbar electrodes 37a can be reduced or prevented. Therefore, an attenuation outside the pass band of the filter 1 can be ensured.

Furthermore, the IDT electrodes 31 and 32 may be arranged along the acoustic wave propagation direction D1. The IDT electrodes 31 and 32 that are adjacent to each other in the acoustic wave propagation direction D1 may include the comb-shaped electrodes 31a and 32b that face towards the same direction and are arranged next to each other along the acoustic wave propagation direction D1. Of the comb-shaped electrodes 31a and 32b, the first comb-shaped electrode 31a may be connected to the second sub-wire 120b, and the second comb-shaped electrode 32b is not necessarily connected to the second sub-wire 120b and may be electrically connected to a ground terminal (for example, the ground terminal G21).

For example, if both pf the comb-shaped electrodes 31a and 32b that are arranged next to each other along the acoustic wave propagation direction D1 are connected to the second sub-wire 120b, capacitance coupling between the comb-shaped electrodes 31a and 32b occurs. As in the present preferred embodiment, by connecting the comb-shaped electrode 31a to the second sub-wire 120b and connecting the comb-shaped electrode 32b to the ground terminal, capacitance coupling between the comb-shaped electrodes 31a and 32b can be reduced or prevented. Thus, signal leakage in the IDT electrode group 25 can be reduced or prevented, and an attenuation outside the pass band of the filter 1 can be ensured.

Furthermore, the first filter circuit 10 may be a transmission filter.

With this arrangement, the transmission filter to which high power is applied can exhibit high electric power handling capability.

Furthermore, the multiplexer 5 according to a preferred embodiment of the present invention includes the first signal terminal T1 and the second signal terminal T2, the filter 1 that is provided on the first path r1 connecting the first signal terminal T1 to the second signal terminal T2, the common terminal Tc that is connected to the second signal terminal T2, the third signal terminal T3 that is different from the first signal terminal T1, the second signal terminal T2, and the common terminal Tc, and the second filter circuit 50 that has a pass band different from the pass band of the first filter circuit 10 and is provided on the second path r2 connecting the common terminal Tc to the third signal terminal T3.

With this arrangement, the multiplexer 5 that includes the filter 1 in which an attenuation outside the pass band is ensured can be provided.

Other Preferred Embodiments

Filters and multiplexers according to preferred embodiments of the present invention have been described above. However, other preferred embodiments provided by combining desired component elements in the foregoing preferred embodiments, modifications obtained by making various changes conceived by those skilled in the art to the foregoing preferred embodiments without departing from the spirit of the present invention, and high frequency front end circuits and communication apparatuses each including filters or multiplexers according to referred embodiments of the present invention are also included in the present invention.

For example, the wiring length of the first sub-wire 120a in a preferred embodiment of the present invention may be shorter than the wiring length of the second sub-wire 120b. Since the first sub-wire 120a does not include a shield structure, generation of a leakage path between the first sub-wire 120a and the main wire 110 can be reduced or prevented by reducing the wiring length of the first sub-wire 120a. Thus, an attenuation outside the pass band of the filter 1 can be ensured.

In a preferred embodiment of the present invention described above, an example in which a first sub-wire 120 in the additional circuit 20 is connected to the node n1 has been described. However, the first sub-wire 120 is not necessarily connected to the node n1 and may be connected to a node between the first signal terminal T1 and the series-arm resonator S1. However, to increase the electric power handling capability of the additional circuit 20, it is preferable that the first sub-wire 120 is not directly connected to the first signal terminal T1 to which a signal is input but be connected to the node n1 at a position after an input signal passes through the series-arm resonator S1.

In a preferred embodiment of the present invention described above, an example in which each of the capacitance elements C1 and C2 includes a pair of comb-shaped electrodes has been described. However, each of the capacitance elements C1 and C2 may include a pair of comb-shaped electrodes including a plurality of electrode fingers extending along the acoustic wave propagation direction D1 so that surface acoustic waves are not excited. Furthermore, the bridging capacitance element C10 may include a pair of comb-shaped electrodes including a plurality of electrode fingers extending along the acoustic wave propagation direction D1.

In a preferred embodiment of the present invention described above, an example in which the IDT electrode group 25 in the additional circuit 20 includes two IDT electrodes has been described. However, the IDT electrode group 25 does not necessarily include two IDT electrodes. The number of IDT electrodes included in the IDT electrode group 25 may be three or more.

In a preferred embodiment of the present invention described above, an example in which the ground wire Lg2 of the parallel-arm resonator P1 is connected to the ground terminal G21 has been described. However, the ground wire Lg2 of the parallel-arm resonator P1 is not necessarily connected to the ground terminal G21 and may be connected to the ground terminal G10. That is, all of the ground wires in the first filter circuit 10 may be connected to the ground terminals G10 and may be isolated from the ground terminals G21 and G22 connected to the additional circuit 20.

In a preferred embodiment of the present invention described above, an example in which the pass band of the filter 1 is set to be lower than the pass band of the second filter circuit 50 has been described. However, the pass band of the filter 1 is not necessarily set to be lower than the pass band of the second filter circuit 50 and may be set to be higher than the pass band of the second filter circuit 50.

In a preferred embodiment of the present invention described above, an example in which the filter 1 is a transmission filter has been described. However, the filter 1 is not necessarily a transmission filter and may be a reception filter. Furthermore, the multiplexer 5 does not necessarily include both a transmission filter and a reception filter. The multiplexer 5 may be include only a transmission filter or only a reception filter.

Furthermore, the first signal terminal T1 and the second signal terminal T2 may be an input terminal or an output terminal. For example, in the case where the first signal terminal T1 is an input terminal, the second signal terminal T2 is an output terminal. In the case where the second signal terminal T2 is an input terminal, the first signal terminal T1 is an output terminal.

Furthermore, the first filter circuit 10 and the second filter circuit 50 do not necessarily have the configuration of a filter described above. The first filter circuit 10 and the second filter circuit 50 may be designed in an appropriate manner in accordance with required filter characteristics or the like. Specifically, the first filter circuit 10 and the second filter circuit 50 do not necessarily have a ladder filter structure and may have, for example, a longitudinally-coupled filter structure. Furthermore, resonators defining the first filter circuit 10 and the second filter circuit 50 are not necessarily SAW resonators and may be, for example, bulk acoustic wave (BAW) resonators. Furthermore, the first filter circuit 10 and the second filter circuit 50 do not necessarily include resonators. The first filter circuit 10 and the second filter circuit 50 may be, for example, LC resonant filters or dielectric filters.

Furthermore, the electrode layer 102 and the insulating layer 130 of the IDT electrodes 31 and 32 and the reflectors 28 are not necessarily made of materials described above. Furthermore, the IDT electrodes 31 and 32 do not necessarily have the multilayer structure described above. The IDT electrodes 31 and 32 may be made of, for example, metal such as Ti, Al, Cu, Pt, Au, Ag, or Pd or alloy and may include a plurality of multilayer bodies made of the metal or alloy described above.

Furthermore, in a preferred embodiment of the present invention, the substrate having piezoelectricity has been described as the substrate 100. However, the substrate may be a piezoelectric substrate of a single piezoelectric layer. The piezoelectric substrate in this case is made of, for example, $LiTaO_3$ piezoelectric single crystal or other types of piezoelectric single crystal such as $LiNbO_3$. Furthermore, the entire substrate 100 on which the IDT electrodes 31 and 32 are provided may be a piezoelectric layer or the substrate 100 may have a structure in which a piezoelectric layer is laminated over a supporting substrate as long as the substrate 100 has a piezoelectricity. Furthermore, the cut angle of the substrate 100 according to a preferred embodiment of the present invention described above is not limited. That is, the multilayer structure, materials, and thickness of the substrate 100 may be changed in an appropriate manner in accordance with required bandpass characteristics of the filter. Even with a surface acoustic wave filter including an $LiTaO_3$ piezoelectric substrate or an $LiNbO_3$ piezoelectric substrate having a cut angle different from the cut angle used in a preferred embodiment of the present invention described above, the same or similar effects can be achieved.

Preferred embodiments of the present invention can be widely used as, for example, a multiplexer, a front end circuit, and a communication apparatus including a filter for communication equipment such as cellular phones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A filter comprising:
a first filter circuit operable in a first frequency band as a pass band; and
an additional circuit connected in parallel to at least a portion of the first filter circuit; wherein
the first filter circuit includes a resonator electrode on a substrate and a main wire connected to the resonator electrode;
the main wire includes a first metal film on the substrate and a second metal film on the first metal film and in contact with the first metal film;
the additional circuit includes an IDT electrode group including a plurality of IDT electrodes on the substrate and a sub-wire on the substrate and connecting the IDT electrode group to the first filter circuit;

at least a portion of the sub-wire includes a third metal film connected to the IDT electrode group;
the third metal film is covered with a fourth metal film with an insulating layer interposed therebetween, the insulating layer being provided on the third metal film; and
the fourth metal film is connected to a ground terminal on the substrate.

2. The filter according to claim 1, wherein the fourth metal film does not cover the main wire but covers the third metal film when viewed from a direction perpendicular or substantially perpendicular to the substrate.

3. The filter according to claim 1, wherein a total sum of a film thickness of the first metal film and a film thickness of the second metal film is larger than a film thickness of the third metal film.

4. The filter according to claim 1, wherein
the first metal film and the third metal film are metal films with a same or substantially a same film thickness and are located at a same or substantially a same height position on the substrate; and
the second metal film and the fourth metal film are metal films with a same or substantially a same film thickness after the first metal film and the third metal film are provided and are located at different height positions on the substrate.

5. The filter according to claim 1, wherein
the additional circuit further includes at least one capacitor portion on an additional path connecting the first filter circuit to the IDT electrode group;
the sub-wire on the additional path includes a first sub-wire connecting the first filter circuit to the at least one capacitor portion and a second sub-wire connecting the at least one capacitor portion to the IDT electrode group;
the first sub-wire includes the first metal film and the second metal film and is not covered with the fourth metal film; and
the second sub-wire includes the third metal film and is covered with the fourth metal film with the insulating layer interposed therebetween.

6. The filter according to claim 5, wherein
the additional circuit includes a plurality of the capacitance portions;
the IDT electrode group includes a first IDT electrode to and from which a signal is input and output and a second IDT electrode to and from which a signal is input and output in a manner opposite to a manner in which a signal is input and output to and from the first IDT electrode;
of the plurality of capacitor portions, a first capacitor portion is provided on the additional path that connects the first filter circuit to the first IDT electrode; and
a second capacitor portion that is different from the first capacitor portion is provided on the additional path that connects the first filter circuit to the second IDT electrode.

7. The filter according to claim 6, wherein
the ground terminal includes a first ground terminal and a second ground terminal that are not connected to each other;
the fourth metal film includes a first fourth metal film and a second fourth metal film that are not connected to each other;

the first fourth metal film covers the third metal film of the second sub-wire that connects the first capacitor portion to the first IDT electrode and is connected to the first ground terminal; and
the second fourth metal film covers the third metal film of the second sub-wire that connects the second capacitor portion to the second IDT electrode and is connected to the second ground terminal.

8. The filter according to claim 5, wherein an electrostatic capacitance of the at least one capacitance portion is smaller than an electrostatic capacitance of the IDT electrode.

9. The filter according to claim 5, wherein
each of the plurality of IDT electrodes includes a plurality of comb-shaped electrodes that face each other;
each of the plurality of comb-shaped electrodes includes a plurality of electrode fingers that intersect in an acoustic wave propagation direction and busbar electrodes that are connected to one end of each of the plurality of electrode fingers; and
of the plurality of comb-shaped electrodes, the busbar electrodes of the comb-shaped electrodes that are connected to the second sub-wire are covered with the fourth metal film with the insulating layer interposed therebetween, the insulating layer being provided on the busbar electrodes.

10. The filter according to claim 9, wherein
the plurality of IDT electrodes are arranged along the acoustic wave propagation direction;
two IDT electrodes adjacent to each other in the acoustic wave propagation direction include two comb-shaped electrodes that face towards a same direction and are arranged next to each other along the acoustic wave propagation direction; and
of the two comb-shaped electrodes, a first comb-shaped electrode is connected to the second sub-wire, and a second comb-shaped electrode is not connected to the second sub-wire but is electrically connected to the ground terminal.

11. The filter according to claim 1, wherein the first filter circuit is a transmission filter.

12. A multiplexer comprising:
a first signal terminal and a second signal terminal;
the filter according to claim 1 on a first path connecting the first signal terminal to the second signal terminal;
a common terminal connected to the second signal terminal;
a third signal terminal different from the first signal terminal, the second signal terminal, and the common terminal; and
a second filter circuit having a pass band different from a pass band of the first filter circuit and provided on a second path connecting the common terminal to the third signal terminal.

13. The multiplexer according to claim 12, wherein the fourth metal film does not cover the main wire but covers the third metal film when viewed from a direction perpendicular or substantially perpendicular to the substrate.

14. The multiplexer according to claim 12, wherein a total sum of a film thickness of the first metal film and a film thickness of the second metal film is larger than a film thickness of the third metal film.

15. The multiplexer according to claim 12, wherein
the first metal film and the third metal film are metal films with a same or substantially a same film thickness and are located at a same or substantially a same height position on the substrate; and the second metal film and the fourth metal film are metal films with a same or substantially a same film thickness after the first metal film and the third metal film are provided and are located at different height positions on the substrate.

16. The multiplexer according to claim 12, wherein
the additional circuit further includes at least one capacitor portion on an additional path connecting the first filter circuit to the IDT electrode group;
the sub-wire on the additional path includes a first sub-wire connecting the first filter circuit to the at least one capacitor portion and a second sub-wire connecting the at least one capacitor portion to the IDT electrode group;
the first sub-wire includes the first metal film and the second metal film and is not covered with the fourth metal film; and
the second sub-wire includes the third metal film and is covered with the fourth metal film with the insulating layer interposed therebetween.

17. The multiplexer according to claim 16, wherein
the additional circuit includes a plurality of the capacitor portions;
the IDT electrode group includes a first IDT electrode to and from which a signal is input and output and a second IDT electrode to and from which a signal is input and output in a manner opposite to a manner in which a signal is input and output to and from the first IDT electrode;
of the plurality of capacitor portions, a first capacitor portion is provided on the additional path that connects the first filter circuit to the first IDT electrode; and
a second capacitor portion that is different from the first capacitor portion is provided on the additional path that connects the first filter circuit to the second IDT electrode.

18. The multiplexer according to claim 17, wherein
the ground terminal includes a first ground terminal and a second ground terminal that are not connected to each other;
the fourth metal film includes a first fourth metal film and a second fourth metal film that are not connected to each other;
the first fourth metal film covers the third metal film of the second sub-wire that connects the first capacitor portion to the first IDT electrode and is connected to the first ground terminal; and
the second fourth metal film covers the third metal film of the second sub-wire that connects the second capacitor portion to the second IDT electrode and is connected to the second ground terminal.

19. The multiplexer according to claim 16, wherein an electrostatic capacitance of the at least one capacitance portion is smaller than an electrostatic capacitance of the IDT electrode.

20. The multiplexer according to claim 16, wherein
each of the plurality of IDT electrodes includes a plurality of comb-shaped electrodes that face each other;
each of the plurality of comb-shaped electrodes includes a plurality of electrode fingers that intersect in an acoustic wave propagation direction and busbar electrodes that are connected to one end of each of the plurality of electrode fingers; and
of the plurality of comb-shaped electrodes, the busbar electrodes of the comb-shaped electrodes that are connected to the second sub-wire are covered with the fourth metal film with the insulating layer interposed therebetween, the insulating layer being provided on the busbar electrodes.

* * * * *